(12) United States Patent
Cao et al.

(10) Patent No.: US 9,665,160 B1
(45) Date of Patent: May 30, 2017

(54) UNIFIED RETENTION FLIP-FLOP ARCHITECTURE AND CONTROL

(71) Applicant: QUALCOMM Incorporated, San Diego, CA (US)

(72) Inventors: Lipeng Cao, La Jolla, CA (US); Divjyot Bhan, Encinitas, CA (US); Harshat Pant, San Diego, CA (US); Ramaprasath Vilangudipitchai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/156,859

(22) Filed: May 17, 2016

(51) Int. Cl.
| | |
|---|---|
| *H03K 3/356* | (2006.01) |
| *G06F 1/32* | (2006.01) |
| *H03K 3/3562* | (2006.01) |
| *H03K 5/08* | (2006.01) |
| *G06F 13/364* | (2006.01) |

(52) U.S. Cl.
CPC ............ *G06F 1/324* (2013.01); *G06F 1/3287* (2013.01); *G06F 13/364* (2013.01); *H03K 3/3562* (2013.01); *H03K 5/08* (2013.01)

(58) Field of Classification Search
CPC ...................................................... H03K 3/037
See application file for complete search history.

(56) References Cited

U.S. PATENT DOCUMENTS

| | | | |
|---|---|---|---|
| 6,720,813 B1 | 4/2004 | Yee et al. | |
| 7,109,749 B2 | 9/2006 | Khanna et al. | |
| 8,493,106 B2 | 7/2013 | Oda | |
| 2009/0309641 A1 | 12/2009 | Park | |
| 2010/0231255 A1* | 9/2010 | Kim | H03K 19/0013 326/33 |
| 2014/0184296 A1 | 7/2014 | Lee et al. | |

* cited by examiner

*Primary Examiner* — Daniel Puentes
(74) *Attorney, Agent, or Firm* — Chui-kiu Teresa Wong; Kenneth Vu

(57) ABSTRACT

An integrated circuit (IC) is disclosed having a unified control scheme and a unifying architecture for different types of retention flip-flops (RFFs). In an example aspect, an IC includes a constant power rail to provide power during a power collapse period and a collapsible power rail to cease providing power during the power collapse period. The IC also includes a positive-edge-triggered (PET) RFF and a negative-edge-triggered (NET) RFF. The PET RFF includes a master portion and a slave portion, with the slave portion coupled to the constant power rail and the master portion coupled to the collapsible power rail. The NET RFF includes master and slave portions, with the master portion coupled to the constant power rail and the slave portion coupled to the collapsible power rail. In another example aspect, a control signal based on a clock and a retention signal may be routed to both RFFs.

22 Claims, 12 Drawing Sheets

UNIFIED RETENTION FLIP-FLOP ARCHITECTURE AND CONTROL

TECHNICAL FIELD

This disclosure relates generally to retention flip-flops that are deployed in an integrated circuit (IC) and, more specifically, to positive-edge-triggered retention flip-flops and negative-edge-triggered retention flip-flops that are architected to enable a unified control scheme.

BACKGROUND

Power consumption of electronic devices is an increasingly important factor in electronic device design. From a global perspective, energy demands of electronic devices occupy a sizable percentage of total energy usage due to large corporate data centers and the ubiquity of personal computing devices. Environmental concerns thus motivate efforts to reduce the power consumption of electronic devices to help conserve the earth's resources. From an individual perspective, less power consumption translates to lower energy bills. Furthermore, many personal computing devices are portable and powered by batteries. The less energy that is consumed by a portable battery-powered electronic device, the longer the portable device may operate without recharging the battery. Lower energy consumption also enables the use of smaller batteries and the adoption of thinner form factors, which means devices can be made more portable or versatile. Therefore, the popularity of portable electronic devices also motivates efforts to reduce the power consumption of electronic devices.

An electronic device consumes power if the device is coupled to a power source and is turned on. This is true for the entire electronic device, but it is also true for individual parts of the electronic device. Hence, power consumption can be reduced if parts of an electronic device are decoupled from power or turned off, even while other parts remain powered and turned on. Entire discrete components of an electronic device, such as a whole integrated circuit (IC) or a display screen, may be decoupled from power or turned off. Alternatively, selected parts of a discrete component may likewise be powered down. For example, a distinct processing entity of an integrated circuit chip, such as a processing core, may be selectively powered down for some period of time to reduce energy consumption.

Powering down a portion of an integrated circuit, such as a core, can save power and extend battery life. Powering down this portion is referred to herein as a "power collapse" or as creating a "power collapse period." Unfortunately, implementing a power collapse of an integrated circuit core can create problems. For example, resuming a computing task using a core that was powered down takes time, which slows performance and can adversely impact a user experience. Operational data, which is data needed for an ongoing computing task, may also be lost if power is removed from certain types of computer memory. Losing operational data may force an application to restart or permanently damage user files, such as documents or pictures. To avoid a loss of operational data when a core of an integrated circuit is being powered down, the operational data can be stored in special memory that maintains data during a power collapse period. Some memory, such as flash memory, is capable of maintaining data when power is removed. Flash memory, however, is unsuitable for high-speed processing because access times are too slow.

Another type of memory that is capable of maintaining data during a power collapse period is called a retention flip-flop (RFF). Generally, flip-flops may be implemented as retention flip-flops or non-retention flip-flops. A flip-flop (FF), or flop, is a unit of computing memory that stores one bit of operational data. Flip-flops are relatively fast memory units, so integrated circuit designers employ flip-flops quite frequently across a chip. A typical flip-flop includes a master portion and a slave portion where data is migrated internally from the master portion to the slave portion. Clocked, or synchronous, flip-flops are configured to enable data migration such that data stored in the master portion is transferred to the slave portion responsive to a pulse of a clock signal.

Non-retention flip-flops are volatile memory that relinquish stored data if powered down, such as with a power collapse of a corresponding core that includes the non-retention flip-flops. Retention flip-flops, on the other hand, are capable of retaining data during a power collapse. In one approach, a retention flip-flop obtains power from a power rail that does not lose power during a power collapse event, so the retention flip-flop can therefore retain the one bit of operational data. Thus, retention flip-flops can support efforts to manage power consumption by facilitating the retention of operational data during a power collapse period without resorting to a slower memory type, such as flash memory.

Unfortunately, existing designs for retention flip-flops are not as robust as those for non-retention flip-flops. Retention flip-flops are more complicated than non-retention flip-flops due to the data retention feature. As a result, existing designs for the more-complicated retention flip-flop are not usable in certain accelerated processing environments in which non-retention flip-flops are capable of functioning. This deficiency prevents the power-conserving benefits of retention flip-flops from being employed in these accelerated processing environments.

SUMMARY

In an example aspect, an integrated circuit is disclosed. The integrated circuit includes a constant power rail configured to provide power during a power collapse period and a collapsible power rail configured to cease providing power during the power collapse period. The integrated circuit also includes a positive-edge-triggered retention flip-flop and a negative-edge-triggered retention flip-flop. The positive-edge-triggered retention flip-flop includes a master portion and a slave portion, with the slave portion coupled to the constant power rail and the master portion coupled to the collapsible power rail. The negative-edge-triggered retention flip-flop also includes a master portion and a slave portion, but the master portion is coupled to the constant power rail and the slave portion is coupled to the collapsible power rail.

In an example aspect, an integrated circuit is disclosed. The integrated circuit includes a constant power rail and a collapsible power rail. The integrated circuit also includes first means for storing data responsive to a positive edge of a clock signal, with the first means including a slave portion coupled to the constant power rail and configured to retain data during a power collapse period and a master portion coupled to the collapsible power rail. The integrated circuit further includes second means for storing data responsive to a negative edge of a clock signal, with the second means including a master portion coupled to the constant power rail and configured to retain data during the power collapse period and a slave portion coupled to the collapsible power rail.

In an example aspect, a method for implementing a unified control scheme with different types of retention flip-flops is disclosed. The method includes propagating a clock signal and propagating a retention signal indicative of a power collapse period and a non-power collapse period. The method also includes combining the clock signal and the retention signal to produce a control signal. The control signal is provided to a positive-edge-triggered retention flip-flop and a negative-edge-triggered retention flip-flop. Additionally, the method includes operating the positive-edge-triggered retention flip-flop based on the control signal during the power collapse period and during the non-power collapse period. The method further includes operating the negative-edge-triggered retention flip-flop based on the control signal during the power collapse period and during the non-power collapse period.

In an example aspect, an integrated circuit is disclosed. The integrated circuit includes a first retention flip-flop configured to transfer data from a master portion to a slave portion responsive to a rising edge of a control signal, with the slave portion configured to retain data during power collapse periods. The integrated circuit also includes a second retention flip-flop configured to transfer data from a master portion to a slave portion responsive to a falling edge of the control signal, with the master portion configured to retain data during the power collapse periods. The integrated circuit further includes power management circuitry configured to produce the control signal based on a clock signal and a retention signal, and to route the control signal to the first retention flip-flop and the second retention flip-flop.

DETAILED DESCRIPTION

Figure 1:
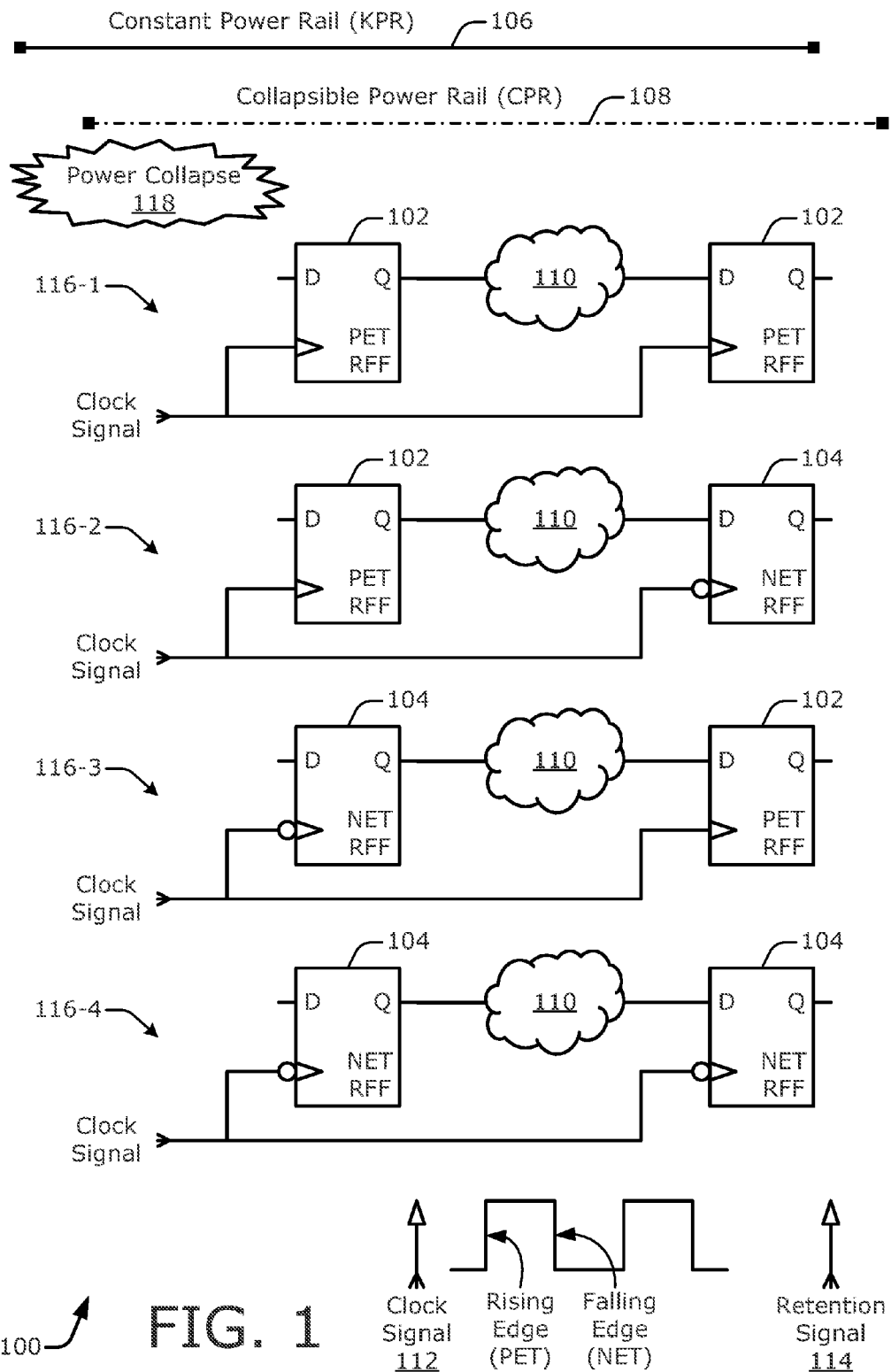
FIG. 1 illustrates different retention flip-flop scenarios that can be implemented in a dual power-rail environment that supports power collapse events in accordance with example embodiments.

Flip-flops typically include two portions: a master portion and a slave portion, with the slave portion serving as the "official" data storage unit, or the main data storage unit. With synchronous flip-flops, data is advanced from the master portion to the slave portion responsive to a pulse of a clock signal. Flip-flops can be implemented as one of two types: a positive-edge-triggered flip-flop or as a negative-edge-triggered flip-flop. With a positive-edge-triggered flip-flop, data is advanced from the master portion into the slave portion responsive to a rising edge of a clock pulse from a low level to a high level. With a negative-edge-triggered flip-flop, data is advanced from the master portion into the slave portion responsive to a falling edge of a clock pulse from a high level to a low level.

With regard to the relatively simpler non-retention flip-flops, positive-edge-triggered non-retention flip-flops and negative-edge-triggered non-retention flip-flops can interoperate together without conflicts. By working together, these two types of non-retention flip-flops enable implementation of an accelerated processing technique that is analogous to processor pipelining because synchronous data propagation can be partially overlapped within a single cycle of a clock signal. In other words, data can be advanced through circuitry more quickly by using this technique with a pair of non-retention flip-flops, with the first of the pair being a positive-edge-triggered non-retention flip-flop and the second being a negative-edge-triggered non-retention flip-flop.

A single cycle of a clock signal includes two halves and a pulse: a first half having a rising edge of the pulse as voltage increases and a second half having a falling edge of the pulse as the voltage decreases. With the accelerated processing technique, the positive-edge-triggered flip-flop operates responsive to the first half of the clock signal as the pulse rises, and the negative-edge-triggered flip-flop operates responsive to the second half of the clock signal as the pulse falls. Thus, with a pair of flip-flops in which one is positive-edge-triggered and the other is negative-edge-triggered, just one clock cycle is consumed to advance data through the two flip-flops because each responds to a different triggering edge of a clock pulse. This technique therefore enables data to be processed at an accelerated speed.

Unfortunately, utilizing this accelerated processing technique with conventional retention flip-flops is problematic. If a conventional positive-edge-triggered retention flip-flop is deployed in the same circuit with a conventional negative-edge-triggered retention flip-flop, clock-clamping conflicts and spurious clock edges result, at least unless complicated and sizable additional circuitry is added to modify and carefully correlate the timings of various control signaling. The resulting clock-clamping conflicts and spurious clock edges cause data to be corrupted and computer programs to malfunction.

Consequently, within a given circuit, conventional retention flip-flops are implemented as positive-edge-triggered retention flip-flops or as negative-edge-triggered retention flip-flops, but not as a combination of both types. This lack of an ability to use both positive-edge-triggered retention flip-flops and negative-edge-triggered retention flip-flops with conventional approaches prevents implementation of the accelerated processing technique that is analogous to processor pipelining. Instead, by using a pair of retention flip-flops that are both positive-edge-triggered or both negative-edge-triggered, two clock cycles are consumed to advance data through the two conventional retention flip-flops because both respond to the same triggering edge of a clock pulse. Hence, conventional retention flip-flop designs are relegated to processing data at half the speed of non-retention flip-flops.

In contrast with conventional designs, example implementations of retention flip-flops that are described herein enable positive-edge-triggered retention flip-flops to operate together with negative-edge-triggered retention flip-flops. Accordingly, the accelerated processing technique that enables data to be advanced twice as fast can be employed with retention flip-flops. Retention flip-flops are described that have a unifying architecture for different types of retention flip-flops and that enable a unified control scheme to be employed for the different types of retention flip-flops.

In one or more embodiments, an integrated circuit includes a constant power rail and a collapsible power rail that ceases to provide power during a power collapse event when power consumption is being reduced. Each portion of a retention flip-flop is coupled to a different one of these two power rails. With a positive-edge-triggered retention flip-flop, a live slave portion is coupled to the constant power rail while a master portion is coupled to the collapsible power rail. With a negative-edge-triggered retention flip-flop, on the other hand, a live master portion is coupled to the constant power rail while a slave portion is coupled to the collapsible power rail. Transfer pass gates, which can isolate a retention flip-flop portion and prevent data corruption from upstream circuitry, are configured to close down and protect the associated retention flip-flop portion during the power collapse. The transfer pass gates of the live slave portion of the positive-edge-triggered retention flip-flop and the live master portion of the negative-edge-triggered retention flip-flop are architected such that both close down to protect stored data for a power collapse period of a retention operational mode. As used herein, an open or a closed state of a pass gate is analogous to a physical gate along a road. A closed pass gate blocks forward propagation, and an open pass gate enables forward propagation. In other words, a pass gate that is described as being in a closed state acts like a switch that has been opened to prevent signal propagation. In contrast, a pass gate that is described as being in an open state acts like a switch that has been closed to permit signal propagation.

In one or more embodiments, a unified control scheme enables the same one or more control signals to be provided to both positive-edge-triggered retention flip-flops and negative-edge-triggered retention flip-flops. For example, the same clock signal and the same retention signal can be fed to both positive-edge-triggered and negative-edge-triggered retention flip-flops. Alternatively, a control signal manager that is external to each retention flip-flop can combine the clock signal and the retention signal to produce a combined control signal. The same combined control signal can be routed from the control signal manager to both positive-edge-triggered and negative-edge-triggered retention flip-flops using a single metallic path. The single control signal can therefore operate both types of retention flip-flops during both a regular operational mode and a retention operational mode.

In these manners, positive-edge-triggered retention flip-flops can interoperate with negative-edge-triggered retention flip-flops to enable the accelerated data processing technique that utilizes both the rising edge and the falling edge of each pulse of a clock signal. Moreover, a unified control scheme can be implemented for both positive-edge-triggered and negative-edge-triggered retention flip-flops to simplify control circuitry that is external of or internal to each retention flip-flop, to reduce the area consumed by the control circuitry, and to also reduce the area consumed by signal traces for control signals being fed to retention flip-flops.

FIG. 1 illustrates generally at 100 different retention flip-flop scenarios 116 that can be implemented in a dual power-rail environment that supports power collapse events in accordance with example embodiments. Two power rails 106 and 108 and four retention flip-flop scenarios 116-1 to 116-4 are shown along with a clock signal 112 and a retention signal 114. A constant power rail 106 (KPR) and a collapsible power rail 108 (CPR) are available to provide power. The collapsible power rail 108 ceases to provide power to enable or cause a power collapse 118 for certain portions of a chip, such as one or more cores or integrated circuit devices. During the power collapse 118, the constant power rail 106 continues to provide power to other portions of the chip. The constant power rail 106 is constant relative to the collapsible power rail 108. However, the constant power rail 106 can stop providing power in other circumstances, such as if a larger block of a chip is being powered down or an entire electronic device is turned off.

Four retention flip-flop scenarios 116-1 to 116-4 are depicted. Each of the first through the fourth retention flip-flop scenarios 116 includes two retention flip-flops and intervening circuitry 110, which is represented by a cloud icon. The two retention flip-flops per scenario are: two positive-edge-triggered (PET) retention flip-flops (RFFs), two negative-edge-triggered (NET) retention flip-flops, or one positive-edge-triggered retention flip-flop (RFF) and one negative-edge-triggered retention flip-flop in two different orders. Two flip-flops are depicted for each retention flip-flop scenario 116 to represent an example of the different combinations of types of retention flip-flops that may be implemented together. However, more than two retention flip-flops may be implemented together for each retention flip-flop scenario 116.

The first retention flip-flop scenario 116-1 includes two positive-edge-triggered retention flip-flops 102. The fourth retention flip-flop scenario 116-4 includes two negative-edge-triggered retention flip-flops 104. The second retention flip-flop scenario 116-2 and the third retention flip-flop scenario 116-3 each include one positive-edge-triggered retention flip-flop 102 and one negative-edge-triggered retention flip-flop 104, but the retention flip-flops are coupled together in different operational orders. A common clock signal is shown triggering both retention flip-flops in each of the four retention flip-flop scenarios 116-1 to 116-4.

The positive-edge-triggered retention flip-flop 102 and the negative-edge-triggered retention flip-flop 104 can be architected such that a common clock signal, or more generally a common control signal, triggers operation of both types of retention flip-flops. The common clock signal operates both types of retention flip-flops while still enabling each type to implement a data retention feature during a power collapse 118. Clock clamping conflicts and spurious clock edges that prevent correct operation can be avoided, even while supporting a retention feature for both positive-edge-triggered retention flip-flops 102 and negative-edge-triggered retention flip-flops 104 that operate responsive to a common clock signal 112 or a common retention signal 114.

For the clock signal 112, an example depiction of a waveform shows multiple clock pulses having rising edges and falling edges. A positive-edge-triggered retention flip-flop 102 is activated by the rising, or positive, edges of the clock signal 112. A negative-edge-triggered retention flip-flop 104 is activated by the falling, or negative, edges of the clock signal 112. The retention signal 114 indicates the beginning and the end of a power collapse 118, depending on whether the retention signal 114 is in an active state or an inactive state, respectively. Example waveforms for different signals are described below with reference to FIG. 2.

Figure 2:
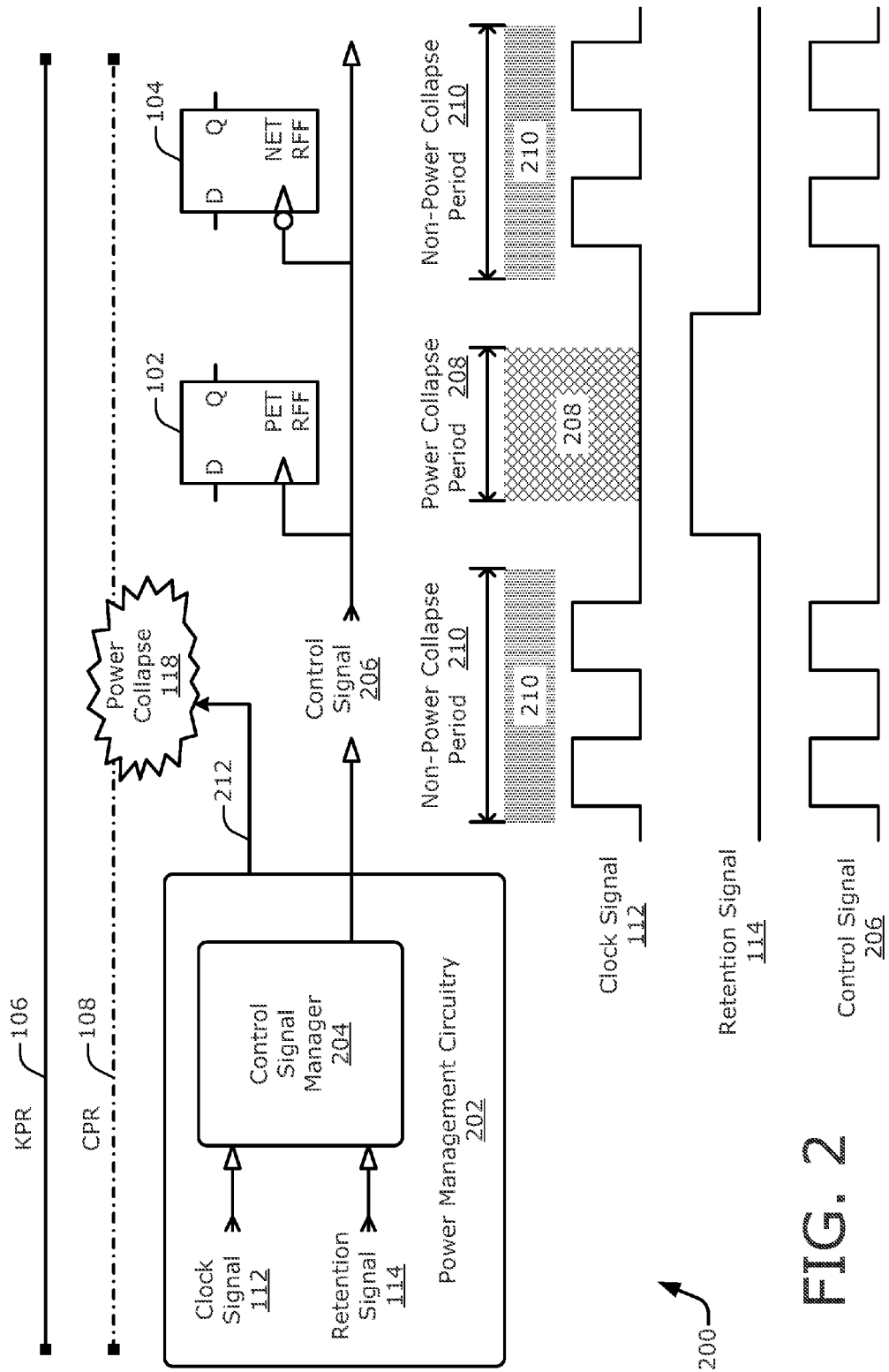
FIG. 2 illustrates example power management circuitry including a control signal manager that utilizes multiple signals in an example control scheme to operate a positive-edge-triggered retention flip-flop and a negative-edge-triggered retention flip-flop.

FIG. 2 illustrates generally at 200 example power management circuitry 202 including a control signal manager 204 that utilizes multiple signals in an example control scheme to operate a positive-edge-triggered retention flip-flop 102 and a negative-edge-triggered retention flip-flop 104. The power management circuitry 202 is responsible for managing power consumption by powering down selected portions of an integrated circuit chip. For example, the power management circuitry 202 can cause a power collapse 118 by turning off power to the collapsible power rail 108 or disconnecting the collapsible power rail 108 from a power source as indicated by command arrow 212. Generally, the power management circuitry 202 can control whether an integrated circuit chip, or a portion thereof, is in a regular operational mode or a retention operational mode, the latter of which involves retaining some data while power is collapsed.

In certain example embodiments, the power management circuitry 202 includes the control signal manager 204. The control signal manager 204 receives the clock signal 112 and the retention signal 114 and combines them to produce a control signal 206. The control signal manager 204 provides the control signal 206 to multiple retention flip-flops, such as multiple flip-fops of a flip-flop tray. The combined control signal 206 is routed to triggering inputs of both positive-edge-triggered retention flip-flops 102 and negative-edge-triggered retention flip-flops 104 to implement a unified control scheme. In a regular operational mode, the control signal manager 204 forwards the clock signal 112 as the control signal 206. In a retention operational mode as indicated by an active retention signal 114, on the other hand, the control signal manager 204 clamps the control signal 206 to a constant value, such as a low logical value or voltage. Thus, the control signal manager 204 generates the control signal 206 based on the clock signal 112 and the retention signal 114. Responsive to a state of the retention signal 114, the control signal manager 204 forwards pulses of the clock signal 112 or clamps the control signal 206 to control the different types of retention flip-flops. The clamped signal is also provided to the retention flip-flops. Alternatively, the clock signal 112 and the retention signal 114 can be individually routed or separately fed to the different types of retention flip-flops (which is not explicitly shown in FIG. 2). Example implementations with individual routings of the clock signal 112 and the retention signal 114 are described below with reference to FIGS. 3B and 4B.

Three waveforms for three different signals are also depicted in FIG. 2, but not necessarily to scale. The waveforms are for the clock signal 112, the retention signal 114, and the control signal 206. The clock signal 112 is shown with multiple clock pulses having rising and falling edges. The pulses of the clock signal 112 cease during a power collapse period 208. The power collapse period 208 corresponds to a power collapse 118 of the collapsible power rail 108 for a retention operational mode. The power collapse 118 is indicated by an active retention signal 114. In this example, the retention signal 114 is driven high to represent an active state, but the circuitry can be implemented alternatively such that the retention signal 114 is active-low. Elapsed times during a regular operational mode correspond to non-power collapse periods 210 as shown. Although not so depicted in FIG. 2, the power collapse period 208 and the non-power collapse periods 210 may be adjacent to each other.

As shown, pulses of the control signal 206 track the pulses of the clock signal 112 in a regular operational mode. However, responsive to the active retention signal 114, the control signal manager 204 clamps the control signal 206 at a constant value in the current example. The constant value is shown to be a low logical value or voltage, but the circuitry can be implemented alternatively such that the control signal 206 is clamped high. The clamped control signal 206 prevents the positive-edge-triggered retention flip-flops 102 and the negative-edge-triggered retention flip-flops 104 from being triggered during the power collapse period 208. Furthermore, as described below, the clamped control signal 206 also ensures that data is safely retained by the retention flip-flops during the power collapse period 208.

Figure 3A:
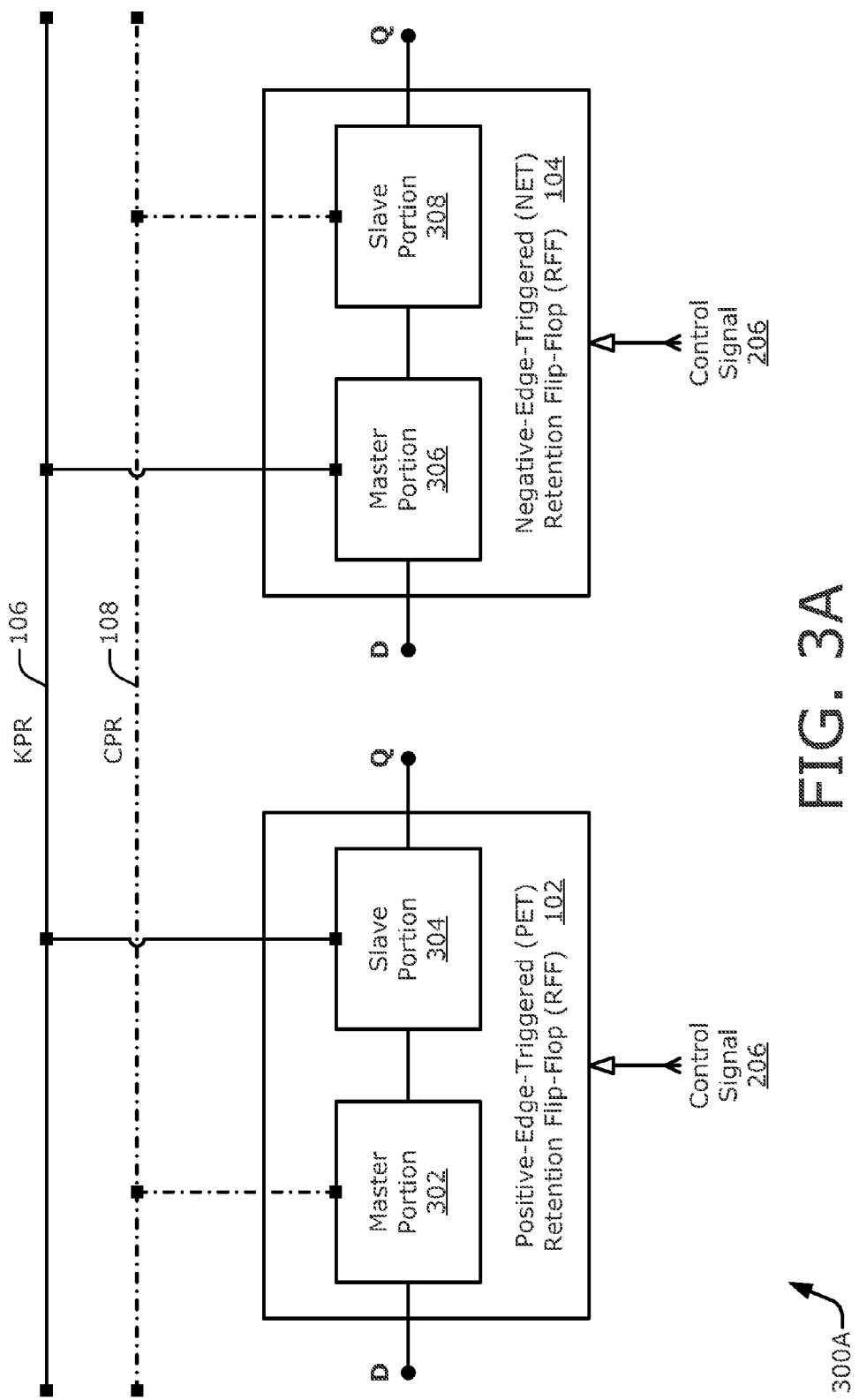
FIGS. 3A and 3B each illustrate an example positive-edge-triggered retention flip-flop and an example negative-edge-triggered retention flip-flop that are both coupled to a constant power rail and a collapsible power rail.
Figure 3B:
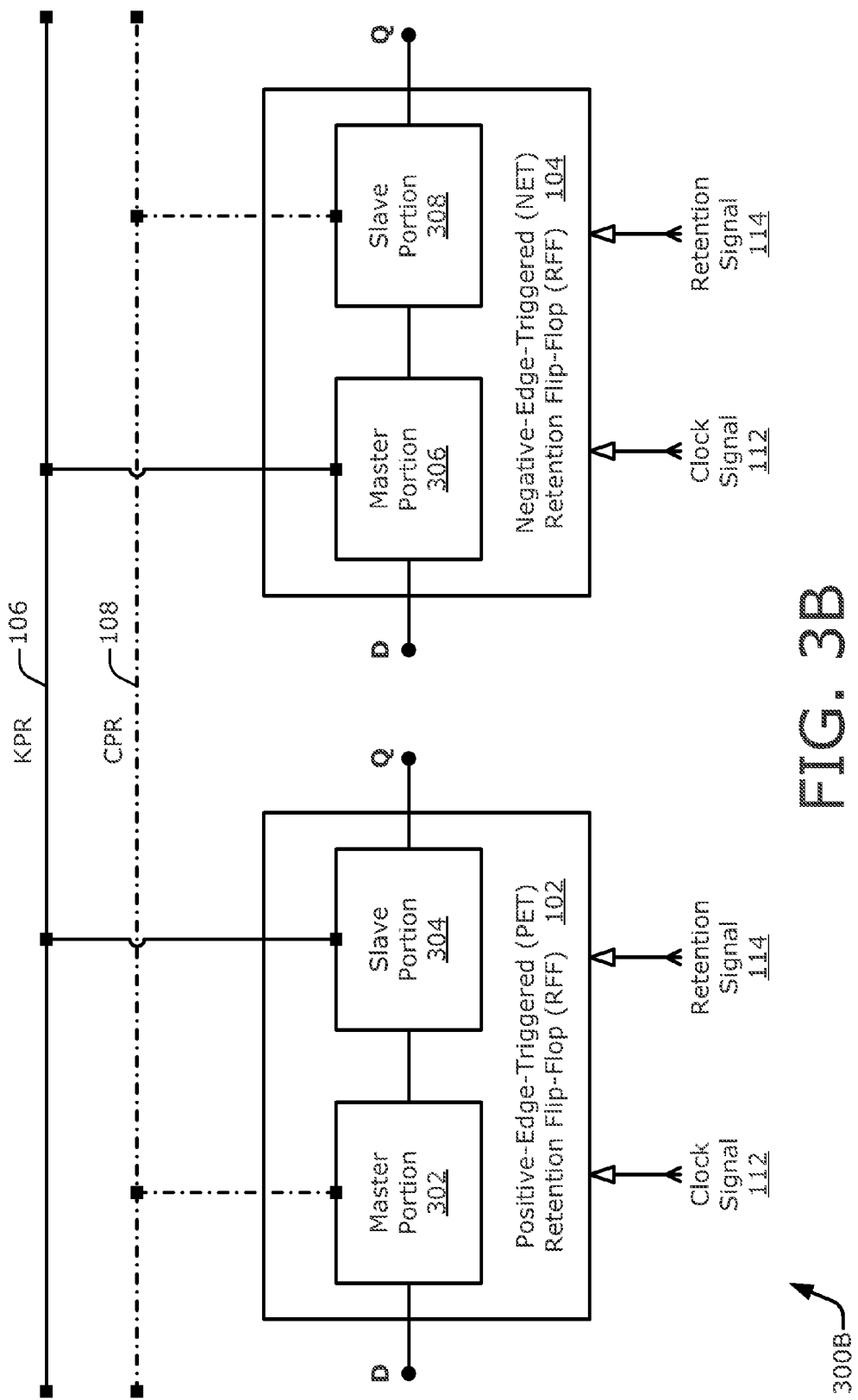

FIGS. 3A and 3B each illustrate generally at 300A and 300B, respectively, an example positive-edge-triggered retention flip-flop 102 and an example negative-edge-triggered retention flip-flop 104 that are both coupled to the constant power rail 106 and the collapsible power rail 108. Each retention flip-flop includes a data input ("D"), a data output ("Q"), a master portion, and a slave portion. The positive-edge-triggered retention flip-flop 102 includes a master portion 302 and a slave portion 304. The negative-edge-triggered retention flip-flop 104 includes a master portion 306 and a slave portion 308. With the positive-edge-triggered retention flip-flop 102, data is advanced or transferred from the master portion 302 to the slave portion 304 responsive to a rising edge of a pulse of a clock or control signal. With the negative-edge-triggered retention flip-flop 104, data is advanced or transferred from the master portion 306 to the slave portion 308 responsive to a falling edge of a pulse of a clock or control signal.

The two retention flip-flops are operated using a unified control scheme. For example, each retention flip-flop can receive the same separate clock signal and the same separate retention signal, or each retention flip-flop can receive the same combined control signal. If each retention flip-flop separately receives the same clock signal and the same retention signal, each retention flip-flop can include internal circuitry that combines the signals or otherwise responds to the two signals to operate pass gates as described herein for both regular and retention operational modes. An example of such an implementation is shown in FIG. 3B. With FIG. 3B, each retention flip-flop separately receives the clock signal 112 and the retention signal 114. In other words, the clock signal 112 and the retention signal 114 are individually routed to the positive-edge-triggered retention flip-flop 102 and the negative-edge-triggered retention flip-flop 104. In the implementation of FIG. 3A, however, each retention flip-flop receives a control signal 206 that already combines the operational effects of separate clock and retention signals using external circuitry that can be shared across multiple retention flip-flops (e.g., the control signal manager 204 of FIG. 2).

For the positive-edge-triggered retention flip-flop 102, the master portion 302 is coupled to the collapsible power rail 108, and the slave portion 304 is coupled to the constant power rail 106. For the negative-edge-triggered retention flip-flop 104, the master portion 306 is coupled to the constant power rail 106, and the slave portion 308 is coupled to the collapsible power rail 108. Accordingly, the slave portion 304 is live during a power collapse to retain data in the positive-edge-triggered retention flip-flop 102, thereby implementing a live slave retention flip-flop. The master portion 306 is live during a power collapse to retain data in the negative-edge-triggered retention flip-flop 104, thereby implementing a live master retention flip-flop. In example implementations, the positive-edge-triggered retention flip-flop 102 or the negative-edge-triggered retention flip-flop 104 can be implemented with non-differential signaling or with voltage-controlled logic, which contrasts with current mode logic (CIVIL).

In a regular operational mode, power is provided to each of the four portions via the constant power rail 106 or the collapsible power rail 108. In a retention operational mode, the retention signal is driven active and power is removed from the collapsible power rail 108 to implement a power collapse. Consequently, the voltage of the collapsible power rail 108 is permitted to drift toward ground as the collapsible power rail 108 ceases to provide power. Hence, the master portion 302 of the positive-edge-triggered retention flip-flop 102 and the slave portion 308 of the negative-edge-triggered retention flip-flop 104 lose power during the power collapse. In contrast, the slave portion 304 of the positive-edge-triggered retention flip-flop 102 and the master portion 306 of the negative-edge-triggered retention flip-flop 104 remain alive during the power collapse to retain data for the positive-edge-triggered retention flip-flop 102 and the negative-edge-triggered retention flip-flop 104, respectively.

Figure 4A:
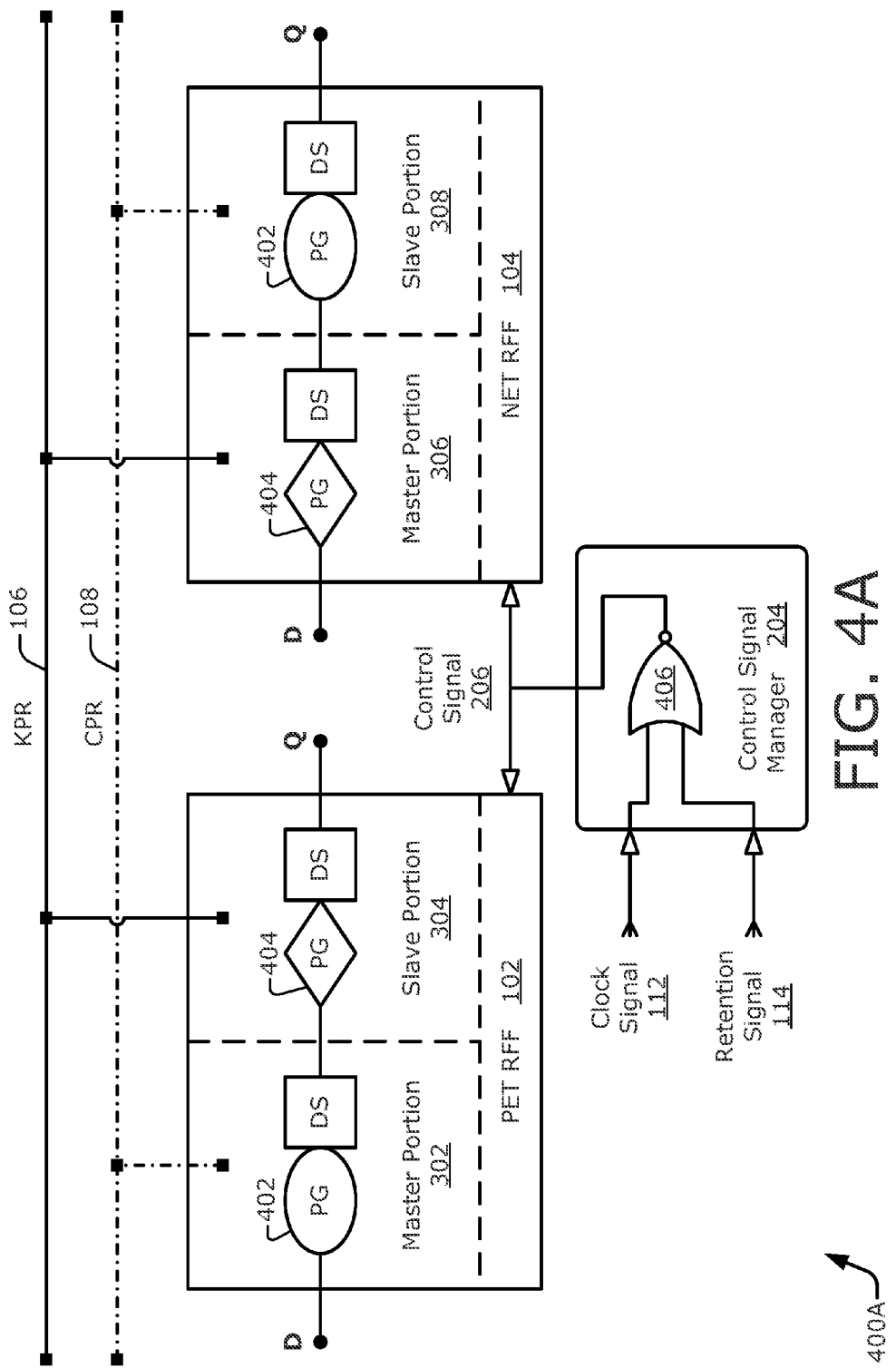
FIGS. 4A and 4B each illustrate an example control scheme for transfer pass gates of the positive-edge-triggered retention flip-flop and the negative-edge-triggered retention flip-flop.
Figure 4B:
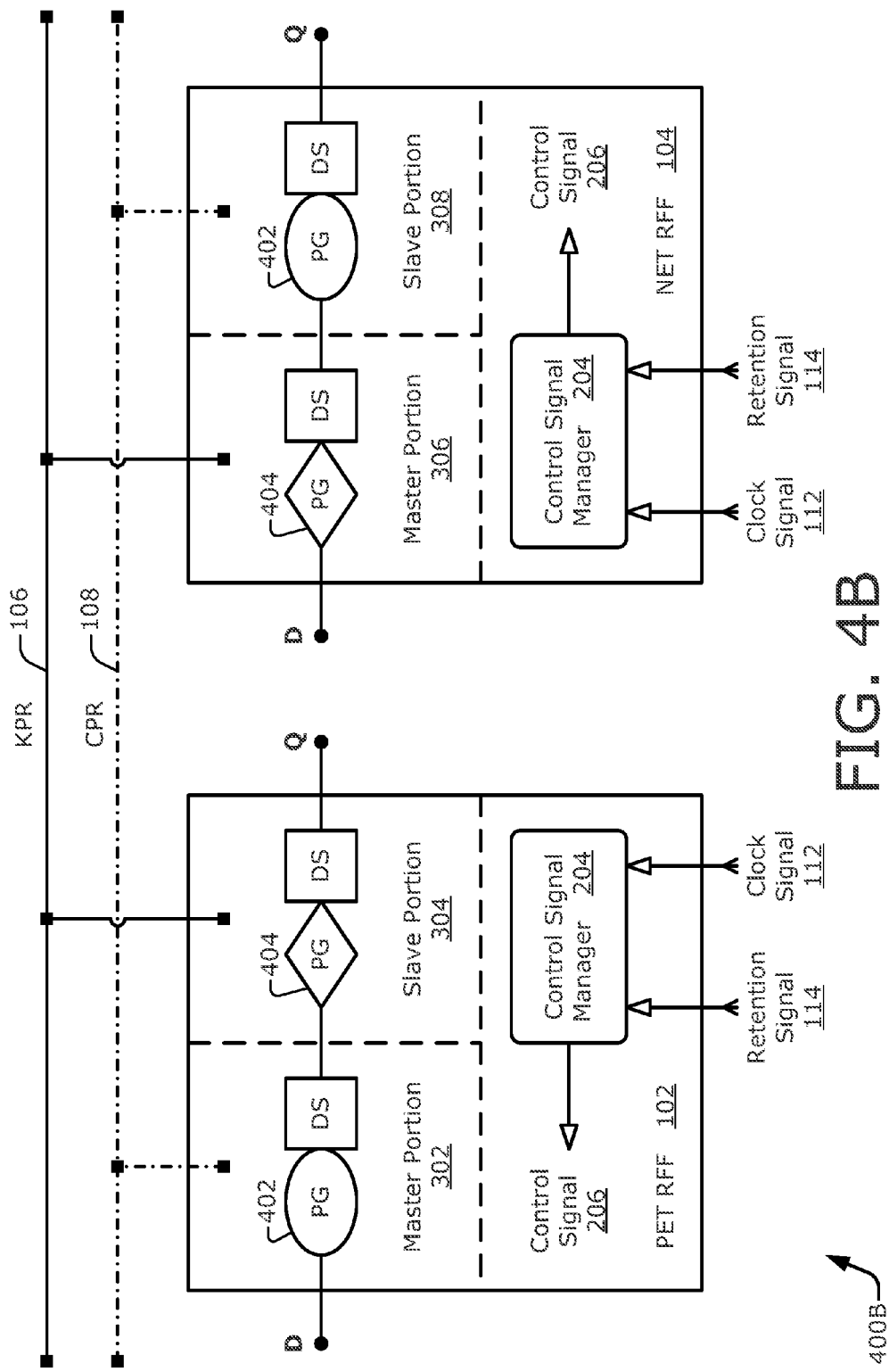

FIGS. 4A and 4B each illustrate an example control scheme 400A and 400B, respectively, for transfer pass gates of the positive-edge-triggered retention flip-flop 102 and the negative-edge-triggered retention flip-flop 104. FIGS. 4A and 4B also depict the constant power rail 106, the collapsible power rail 108, and a version of the control signal manager 204. With reference to FIG. 4A, the control signal manager 204 produces the control signal 206 based on the clock signal 112 and the retention signal 114. Circuitry, such as the power management circuitry 202 (of FIG. 2), routes the control signal 206 to both the positive-edge-triggered retention flip-flop 102 and the negative-edge-triggered retention flip-flop 104 using one signal line, such as a single metallic path. The control signal manager 204, which is external to the two retention flip-flops, can be shared across multiple retention flip-flops to reduce the area occupied by the signal processing and signal propagation circuitry.

In certain example embodiments for the control scheme 400, pass gates of the different types of retention flip-flops are configured to operate so as to enable a selected live portion to retain data while another portion is permitted to undergo a power collapse responsive to at least one signal. Each master portion and each slave portion of a retention flip-flop includes at least two components: a pass gate and a data storage unit. In FIG. 4A, the rectangular components represent data storage units ("DS"), and the oval and diamond components represent pass gates ("PG"), which are also referred to as transmission gates. In operation, each oval-shaped pass gate 402 is in a closed state (e.g., acts like a switch that has been opened to prevent signal propagation) if the control signal 206 is high. Thus, each oval-shaped pass gate 402 is in an open state (e.g., acts like a switch that has been closed to permit signal propagation) if the control signal 206 is low. Each diamond-shaped pass gate 404, on the other hand, is in a closed state if the control signal 206 is low. Thus, each diamond-shaped pass gate 404 is in an open state if the control signal 206 is high. In an alternative implementation, the logical value or voltage levels may be swapped.

The master portion 302 of the positive-edge-triggered retention flip-flop 102 and the slave portion 308 of the negative-edge-triggered retention flip-flop 104 each include an oval-shaped pass gate 402 that is closed if the control signal 206 is high but that is open if the control signal 206 is low. The live slave portion 304 of the positive-edge-triggered retention flip-flop 102 and the live master portion 306 of the negative-edge-triggered retention flip-flop 104 each include a diamond-shaped pass gate 404 that is closed if the control signal 206 is low but that is open if the control signal 206 is high. This arrangement enables the non-live portions of the different types of retention flip-flops to be opened and closed responsive to the same-valued signal and the live portions of the different types of retention flip-flops to be opened and closed responsive to the same-valued signal. The value of the signal, however, is reversed for the live portions as compared to the non-live portions.

In a regular operational mode, the control signal manager 204 forwards the clock signal 112 as the control signal 206 to the two retention flip-flops. Responsive to a rising edge of a pulse of the control signal 206, the two diamond-shaped pass gates 404 open and permit data to propagate to the slave portion 304 of the positive-edge-triggered retention flip-flop 102 and to the master portion 306 of the negative-edge-triggered retention flip-flop 104. Responsive to a falling edge of a pulse of the control signal 206, the two oval-shaped pass gates 402 open and permit data to propagate to the master portion 302 of the positive-edge-triggered retention flip-flop 102 and to the slave portion 308 of the negative-edge-triggered retention flip-flop 104.

In a retention operational mode for a power collapse event, the control signal manager 204 clamps the control signal 206 to a constant value responsive to an active indication or state of the retention signal 114. In an example, the control signal 206 is clamped low if the retention operational mode is engaged. The low value of the control signal 206 closes the diamond-shaped pass gates 404 of the live slave portion 304 of the positive-edge-triggered retention flip-flop 102 and the live master portion 306 of the negative-edge-triggered retention flip-flop 104. The closings of the diamond-shaped pass gates 404 isolate the live slave portion 304 and the live master portion 306 to protect data stored by those respective portions during the power collapse event. After power is removed from the collapsible power rail 108, the voltage level thereof drops, and the voltage level can drift toward ground in the master portion 302 of the positive-edge-triggered retention flip-flop 102 and in the slave portion 308 of the negative-edge-triggered retention flip-flop 104. Meanwhile, stored data is safely retained in the live slave portion 304 of the positive-edge-triggered retention flip-flop 102 and in the live master portion 306 of the negative-edge-triggered retention flip-flop 104, which are both coupled to the constant power rail 106 and isolated from upstream circuitry by a diamond-shaped pass gate 404.

The control signal manager 204 can be implemented to include, for example, a logical NOR gate 406. The NOR gate 406 receives at first and second inputs the clock signal 112 and the retention signal 114, respectively, and produces at an output the control signal 206. In accordance with a logical NOR operation, if the retention signal 114 is a logical low, then the values of the clock signal 112 are output (in inverted form) as the control signal 206. On the other hand, if the retention signal 114 is a logical high, then the control signal 206 is clamped at a logical low level. Example implementations of a control signal manager 204, which may include an additional inverter to flip the clock pulse output, are described below with reference to FIGS. 7 and 8.

With reference to FIG. 4B, the retention flip-flops of the control scheme 400B operate analogously to those of FIG. 4A. However, each of the two retention flip-flops includes a control signal manager 204 that is internal thereto. Circuitry, such as the power management circuitry 202 (of FIG. 2), individually routes the clock signal 112 and the retention signal 114 to both the positive-edge-triggered retention flip-flop 102 and the negative-edge-triggered retention flip-flop 104 using separate signal lines, such as two different metallic paths. The clock signal 112 and the retention signal 114 are combined internal to each retention flip-flop. The control signal manager 204 within each retention flip-flop produces the control signal 206 based on the clock signal 112 and the retention signal 114 and may operate similarly to the control signal manager 204 of the control scheme 400A. Alternatively, the clock signal 112 and the retention signal 114 may be utilized separately in different manners to cause the two oval-shaped pass gates 402 and the two diamond-shaped pass gates 404 to operate as described herein for both regular and retention operational modes.

Figure 5:
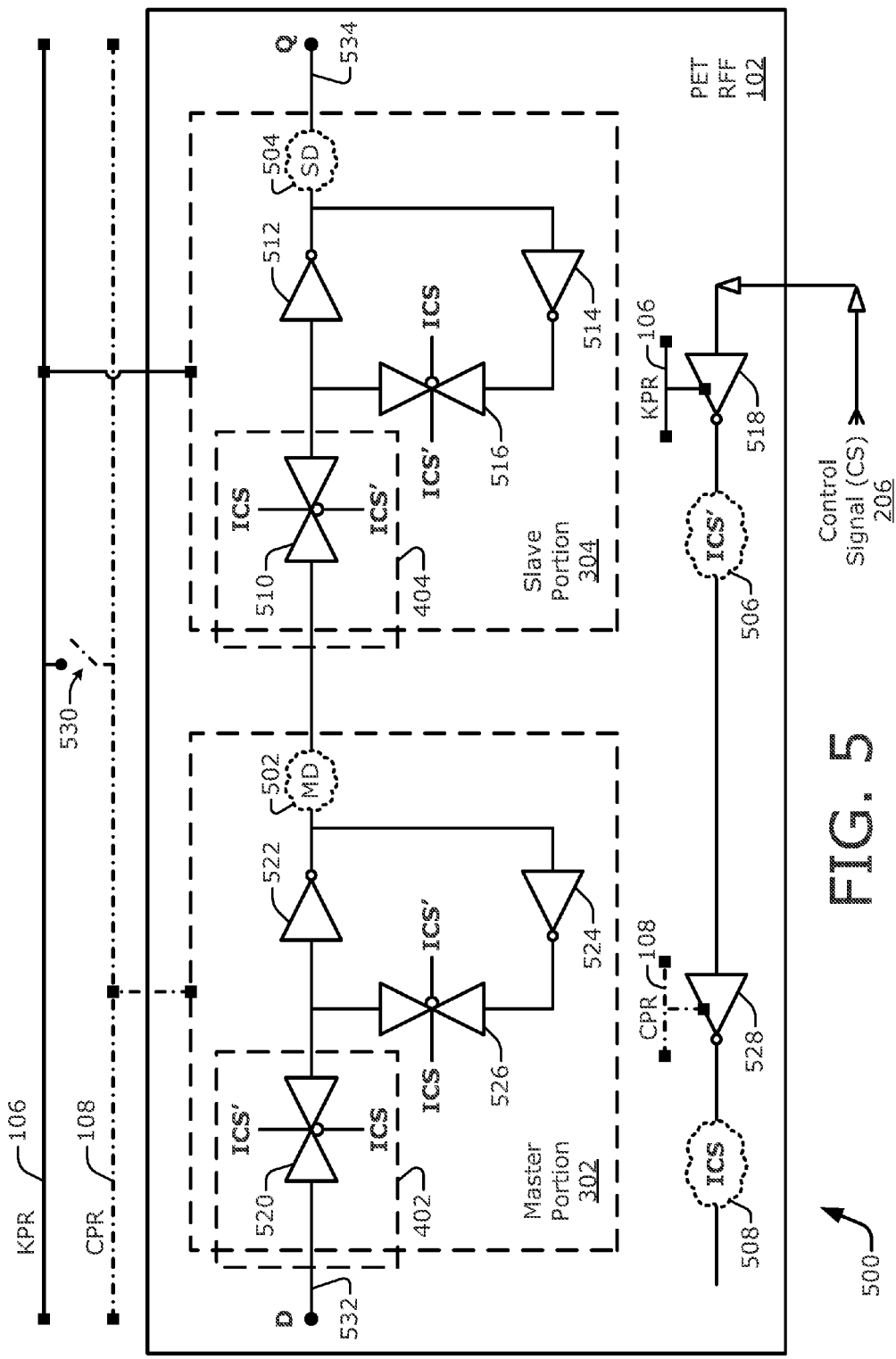
FIG. 5 illustrates an example gate-level implementation of a positive-edge-triggered retention flip-flop.

FIG. 5 illustrates an example gate-level implementation 500 of a positive-edge-triggered retention flip-flop 102 that is coupled to two different power rails in accordance with FIG. 3A or 4A. The master portion 302 is operably connected to the collapsible power rail 108, and the slave portion 304 is operably connected to the constant power rail 106. A switch 530 is provided between the collapsible power rail 108 and the constant power rail 106. When the switch 530 is in the open position as shown in FIG. 5, the collapsible power rail 108 is disconnected from the constant power rail 106, and a power collapse can occur. In addition to the master portion 302 and the slave portion 304, the positive-edge-triggered retention flip-flop 102 includes an input 532 ("D"), an output 534 ("Q"), a first inverter 518, and a second inverter 528. As shown, the master portion 302 and the slave portion 304 each include two pass gates and two inverters. These eight circuit devices are described below. The master portion 302 also includes master data 502 at an output of the master portion 302, and the slave portion 304 also includes slave data 504 at an output of the slave portion 304.

In one or more embodiments, the master portion 302 and the corresponding slave portion 304 of the positive-edge-triggered retention flip-flop 102 are arranged in series. The input 532 of the retention flip-flop coincides with an input of the master portion 302. The master data 502 is located at the output of the master portion 302. The output of the master portion 302 coincides with an input of the slave portion 304. The slave data 504 is located at the output of the slave portion 304. The output of the slave portion 304 coincides with the output 534 of the retention flip-flop. The master data 502 of the master portion 302 may be represented by a voltage level at the output of the master portion 302. The slave data 504 of the slave portion 304 may be represented by a voltage level at the output of the slave portion 304.

The master portion 302, and the individual circuit devices thereof, are coupled to and powered by the collapsible power rail 108. The slave portion 304, and the individual circuit devices thereof, are coupled to and powered by the constant power rail 106. The switch 530 is configured to selectively couple the collapsible power rail 108 to the constant power rail 106 under control of the power management circuitry 202 (of FIG. 2). The switch 530 illustrates an example of how the collapsible power rail 108 may be powered during a regular operational mode and how the collapsible power rail 108 may be decoupled from power during a retention operational mode. The decoupling removes power from the collapsible power rail 108 to implement a power collapse. In contrast, during a regular operational mode, the switch 530 is closed to couple the collapsible power rail 108 to the constant power rail 106 so as to provide power to the collapsible power rail 108 from the constant power rail 106.

In an example scenario for a power collapse event, the switch 530 is opened such that power is removed from the collapsible power rail 108. The master portion 302 of the positive-edge-triggered retention flip-flop 102 is configured to relinquish the master data 502 of the master portion 302 if power ceases to be provided by the collapsible power rail 108. If the master data 502 is being relinquished, the voltage level at the output of the master portion 302 begins to drop or drift toward a ground voltage level. The slave portion 304 of the retention flip-flop, on the other hand, is configured to retain the slave data 504 of the slave portion 304 if power is removed from the collapsible power rail 108 because the slave portion 304 is coupled to the constant power rail 106. If the slave data 504 is retained during a power collapse event, the slave data 504 is available for a subsequent computing task after the power collapse event ends.

As illustrated in FIG. 5, the master portion 302 includes a transfer pass gate 520, a forward inverter 522, a feedback inverter 524, and a feedback pass gate 526. The names of the pass gates and the inverters are assigned merely to facilitate understanding of the principles described herein, and the names are not intended to be limiting. The pass gates of the master portion 302 and of the slave portion 304 may be constructed using at least one field effect transistor (FET) per pass gate, such as two FETs for each pass gate. As shown, each pass gate includes a negative gate terminal and a positive gate terminal. The negative gate terminal leads to an n-type FET (NFET), and the positive gate terminal leads to a p-type FET (PFET). Pass gates may also be referred to as transmission gates.

The transfer pass gate 520 (or master transfer pass gate) enables or disables an input interface for the master portion 302 so as to enable or disable the transfer of data into the master portion 302 as the new master data 502. The forward inverter 522 is aligned with a direction of data migration or movement across the positive-edge-triggered retention flip-flop 102, and the feedback inverter 524 is aligned against a direction of data migration across the retention flip-flop. The feedback inverter 524 and the feedback pass gate 526 form part of a feedback path that maintains a current version of the master data 502 at the output of the master portion 302 if the feedback pass gate 526 (or master feedback pass gate) is in an open state (e.g., acting like a switch that has been closed to permit signal propagation).

More specifically, an input of the transfer pass gate 520 coincides with an input of the master portion 302 as well as the input 532 of the positive-edge-triggered retention flip-flop 102. An output of the transfer pass gate 520 is coupled to an output of the feedback pass gate 526 and to an input of the forward inverter 522. An output of the forward inverter 522 drives the master data 502 and coincides with the output of the master portion 302. The output of the forward inverter 522 is coupled to an input of the feedback inverter 524. An output of the feedback inverter 524 is coupled to an input of the feedback pass gate 526. As noted above, the output of the feedback pass gate 526 is coupled to the output of the transfer pass gate 520 and to the input of the forward inverter 522, which forms a feedback loop for the master portion 302 if the feedback pass gate 526 is in the open state.

As illustrated in FIG. 5, the slave portion 304 includes a transfer pass gate 510, a forward inverter 512, a feedback inverter 514, and a feedback pass gate 516. The transfer pass gate 510 (or slave transfer pass gate) enables or disables an input interface for the slave portion 304 so as to enable or disable the transfer of data into the slave portion 304 as the new slave data 504. The forward inverter 512 is aligned with a direction of data migration or movement across the positive-edge-triggered retention flip-flop 102, and the feedback inverter 514 is aligned against a direction of data migration across the retention flip-flop. The feedback inverter 514 and the feedback pass gate 516 form part of a feedback path that maintains a current version of the slave data 504 at the output of the slave portion 304 if the feedback pass gate 516 (or slave feedback pass gate) is in an open state.

More specifically, an input of the transfer pass gate 510 coincides with an input of the slave portion 304 as well as the output of the master portion 302. An output of the transfer pass gate 510 is coupled to an output of the feedback pass gate 516 and to an input of the forward inverter 512. An output of the forward inverter 512 drives the slave data 504 and coincides with the output of the slave portion 304, as well as the output 534 of the positive-edge-triggered retention flip-flop 102. The output of the forward inverter 512 is coupled to an input of the feedback inverter 514. An output of the feedback inverter 514 is coupled to an input of the feedback pass gate 516. As noted above, the output of the feedback pass gate 516 is coupled to the output of the transfer pass gate 510 and to the input of the forward inverter 512, which forms a feedback loop for the slave portion 304 if the feedback pass gate 516 is in an open state.

Figure 6:
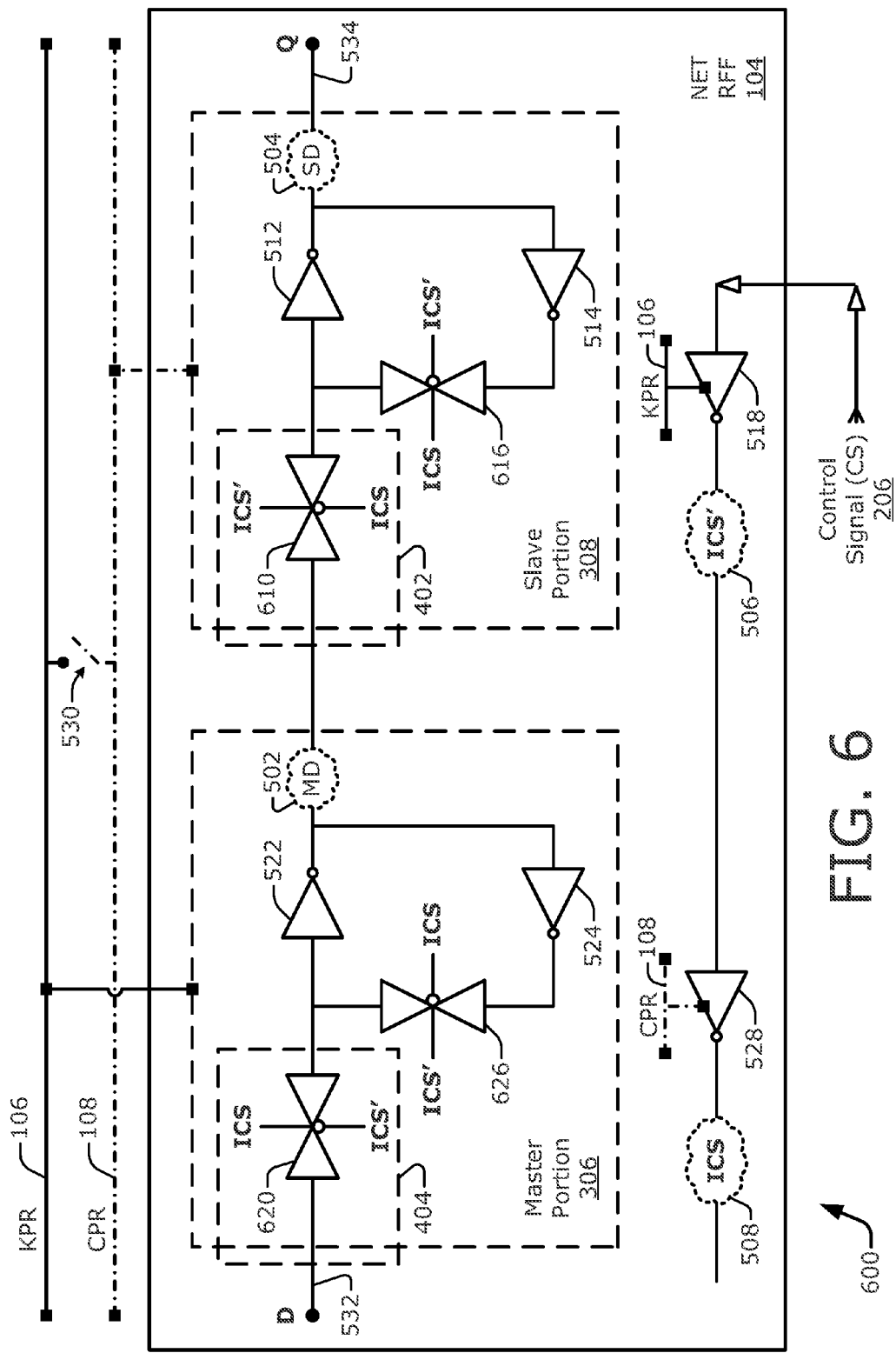
FIG. 6 illustrates an example gate-level implementation of a negative-edge-triggered retention flip-flop.

As described above with reference to FIG. 4A, the control signal manager 204 is configured to produce the control signal 206 (CS) based on the clock signal 112 and the retention signal 114. The control signal manager 204 is further configured to provide the control signal 206 to each retention flip-flop of multiple retention flip-flops via at least one signal line, such as a conductive trace or metal wire. As shown in FIG. 5, the control signal 206 is provided to the positive-edge-triggered retention flip-flop 102 at an input of the first inverter 518. This input coincides with a single electrical input for providing the control signal 206 to the positive-edge-triggered retention flip-flop 102 (or to a negative-edge-triggered retention flip-flop 104 as shown in FIG. 6).

In one or more embodiments, the first inverter 518, like the slave portion 304, is coupled to and powered by the constant power rail 106 (KPR) as shown. The second inverter 528, like the master portion 302, is coupled to and powered by the collapsible power rail 108 (CPR). An output of the first inverter 518 is coupled to an input of the second inverter 528. The first inverter 518 receives the control signal 206 and inverts a value of the control signal 206 to produce a complemented internal control signal 506 (ICS') at the output of the first inverter 518. The complemented internal control signal 506 (ICS') is provided to the input of the second inverter 528. The second inverter 528 inverts a value of the complemented internal control signal 506 (ICS') to produce an internal control signal 508 (ICS) at the output of the second inverter 528. The complemented internal control signal 506 (ICS') and the internal control signal 508 (ICS) are coupled to separate control terminals of the pass gates 510, 516, 520, and 526, as shown, to control whether each pass gate is open or closed.

For the positive-edge-triggered retention flip-flop 102 of FIG. 5, the transfer pass gate 520 of the master portion 302 corresponds to the transfer, oval-shaped pass gate 402, which is shown as such in FIG. 4A and indicated by reference number in FIG. 5. The transfer pass gate 510 of the slave portion 304 corresponds to the transfer, diamond-shaped pass gate 404. For the transfer pass gate 520 and the feedback pass gate 516, the complemented internal control signal 506 (ICS') is fed to a negative gate terminal, and the internal control signal 508 (ICS) is fed to a positive gate terminal. For the transfer pass gate 510 and the feedback pass gate 526, the complemented internal control signal 506 (ICS') is fed to a positive gate terminal, and the internal control signal 508 (ICS) is fed to a negative gate terminal. An example operation of the positive-edge-triggered retention flip-flop 102 is described here; however, a negative-edge-triggered retention flip-flop 104 may operate analogously as described below with reference to FIG. 6.

In a data hold phase for a regular operational mode, data is not migrated from the master portion 302 to the slave portion 304. For the data hold phase, the transfer pass gate 520 and the feedback pass gate 516 are both in an open state to permit signals to pass through the pass gates 520 and 516, and the feedback pass gate 526 and the transfer pass gate 510 are both in a closed state to prevent signals from passing through the pass gates 526 and 510. To create these conditions for the data hold phase, the complemented internal control signal 506 (ICS') is brought to a high value, and the internal control signal 508 (ICS) is brought to a low value. In a data migration phase for the regular operational mode of the positive-edge-triggered retention flip-flop 102, data is migrated from the master portion 302 to the slave portion 304 responsive to a rising edge of the control signal 206. For the data migration phase, the transfer pass gate 520 and the feedback pass gate 516 are both placed in a closed state to prevent signals from passing through the pass gates 520 and 516, and the feedback pass gate 526 and the transfer pass gate 510 are both placed in an open state to permit signals to pass through the pass gates 526 and 510. To create these conditions for the data migration phase, the complemented internal control signal 506 (ICS') is driven to a low value, and the internal control signal 508 (ICS) is driven to a high value.

Thus, in a regular operational mode, the transfer pass gate 510 is opened or closed based on a data hold phase or a data migration phase of the positive-edge-triggered retention flip-flop 102 as described above. If the retention flip-flop is migrating the master data 502 of the master portion 302 to be the next slave data 504 of the slave portion 304, the transfer pass gate 510 is opened to permit signals to propagate and voltages to change. If, on the other hand, the retention flip-flop is not migrating data from the master portion 302 to the slave portion 304, the transfer pass gate 510 is closed and the feedback pass gate 516 is opened to maintain the current slave data 504 using the feedback loop that also includes the feedback inverter 514.

In a retention operational mode during a power collapse event, to implement a data retention feature of the positive-edge-triggered retention flip-flop 102, the transfer pass gate 510 is maintained in a closed state (e.g., acts like a switch that has been opened to prevent signal propagation) to isolate the slave portion 304 from the master portion 302. The feedback pass gate 516 may be kept open to ensure that the slave data 504 is retained by the slave portion 304. To place the transfer pass gate 510 in a closed state and the feedback pass gate 516 in an open state, the complemented internal control signal 506 (ICS') is driven to or maintained at a high voltage level, and the internal control signal 508 (ICS) is driven to, maintained at, or permitted to drift to a low voltage level. To maintain the complemented internal control signal 506 (ICS') and the internal control signal 508 (ICS) at these voltage levels during a power collapse period 208 (of FIG. 2), the control signal 206 is maintained at a low voltage level during the power collapse event. Example approaches to driving or maintaining the control signal 206 at a low voltage level during a power collapse event are described herein with particular reference to FIGS. 7 and 8.

As indicated above, the second inverter 528 is powered by the collapsible power rail 108. The collapsibility of the second inverter 528 is enabled because the output thereof, which is the internal control signal 508 (ICS), is configured to have a low value during the power collapse period while still contributing to the placement of the transfer pass gate 510 in a closed state and the feedback pass gate 516 in an open state. Thus, the output of the second inverter 528 has a correct value for retaining the slave data 504 even if the second inverter 528 undergoes a power collapse.

FIG. 6 illustrates an example gate-level implementation 600 of a negative-edge-triggered retention flip-flop 104 that is coupled to two different power rails in accordance with FIG. 3A or 4A. Many of the circuit devices and interconnections described above with reference to the positive-edge-triggered retention flip-flop 102 of FIG. 5 are similar or analogous to those of the negative-edge-triggered retention flip-flop 104. A number of differences are architected to enable a negative-edge-triggered retention flip-flop 104 to operate along with a positive-edge-triggered retention flip-flop 102 in accordance with a unified control scheme. For example, the master portion 306 is operably connected to the constant power rail 106, and the slave portion 308 is operably connected to the collapsible power rail 108.

In contrast with the positive-edge-triggered retention flip-flop 102 of FIG. 5, the live master portion 306 is coupled to the constant power rail 106 and is responsible for retaining data, the master data 502, during a power collapse period 208. The slave portion 308, on the other hand, is permitted to undergo a power collapse during the power collapse period 208. Consequently, the pass gates of the negative-edge-triggered retention flip-flop 104 are wired differently as compared to those of a positive-edge-triggered retention flip-flop 102. As shown in FIG. 6, the master portion 306 includes a transfer pass gate 620 (or master transfer pass gate) and a feedback pass gate 626 (or master feedback pass gate). The transfer pass gate 620 enables or disables an input interface for the master portion 306 so as to enable or disable the transfer of data into the master portion 306 as the new master data 502. The slave portion 308 includes a transfer pass gate 610 (or slave transfer pass gate) and a feedback pass gate 616 (or slave feedback pass gate). The transfer pass gate 610 enables or disables an input interface for the slave portion 308 so as to enable or disable the transfer of data into the slave portion 308 as the new slave data 504.

For the negative-edge-triggered retention flip-flop 104 of FIG. 6, the transfer pass gate 620 of the master portion 306 corresponds to the transfer, diamond-shaped pass gate 404, which is shown as such in FIG. 4A and indicated by reference number in FIG. 6. The transfer pass gate 610 of the slave portion 308 corresponds to the transfer, oval-shaped pass gate 402. Thus, the internal control signal routing for the various pass gates is reversed or inverted for the negative-edge-triggered retention flip-flop 104 as compared to that of the positive-edge-triggered retention flip-flop 102 of FIG. 5. For the transfer pass gate 620 and the feedback pass gate 616, the complemented internal control signal 506 (ICS') is fed to a positive gate terminal, and the internal control signal 508 (ICS) is fed to a negative gate terminal. For the transfer pass gate 610 and the feedback pass gate 626, the complemented internal control signal 506 (ICS') is fed to a negative gate terminal, and the internal control signal 508 (ICS) is fed to a positive gate terminal. An example operation of the negative-edge-triggered retention flip-flop 104 is described here; however, a positive-edge-triggered retention flip-flop 102 may operate analogously as described above with reference to FIG. 5.

In a data hold phase for a regular operational mode, data is not migrated from the master portion 306 to the slave portion 308. For the data hold phase, the transfer pass gate 620 and the feedback pass gate 616 are both in an open state to permit signals to pass through the pass gates 620 and 616, and the feedback pass gate 626 and the transfer pass gate 610 are both in a closed state to prevent signals from passing through the pass gates 626 and 610. To create these conditions for the data hold phase, the complemented internal control signal 506 (ICS') is brought to a low value, and the internal control signal 508 (ICS) is brought to a high value. In a data migration phase for the regular operational mode of the negative-edge-triggered retention flip-flop 104, data is migrated from the master portion 306 to the slave portion 308 responsive to a falling edge of the control signal 206. For the data migration phase, the transfer pass gate 620 and the feedback pass gate 616 are both placed in a closed state to prevent signals from passing through the pass gates 620 and 616, and the feedback pass gate 626 and the transfer pass gate 610 are both placed in an open state to permit signals to pass through the pass gates 626 and 610. To create these conditions for the data migration phase, the complemented internal control signal 506 (ICS') is driven to a high value, and the internal control signal 508 (ICS) is driven to a low value.

Thus, in a regular operational mode, the transfer pass gate 610 is opened or closed based on a data hold phase or a data migration phase of the negative-edge-triggered retention flip-flop 104 as described above. If the retention flip-flop is migrating the master data 502 of the master portion 306 to be the next slave data 504 of the slave portion 308, the transfer pass gate 610 is opened to permit signals to propagate and voltages to change. If, on the other hand, the retention flip-flop is not migrating data from the master portion 306 to the slave portion 308, the transfer pass gate 610 is closed and the feedback pass gate 616 is opened to maintain the current slave data 504 using the feedback loop that also includes the feedback inverter 514.

In a retention operational mode during a power collapse event, to implement a data retention feature of the negative-edge-triggered retention flip-flop 104, the transfer pass gate 620 is maintained in a closed state (e.g., acts like a switch that has been opened to prevent signal propagation) to isolate the master portion 306 from upstream circuitry. The feedback pass gate 626 may be kept open to ensure that the current master data 502 is retained by the master portion 306 using the feedback loop that also includes the feedback inverter 524, as well as the forward inverter 522. To place the transfer pass gate 620 in a closed state and the feedback pass gate 626 in an open state, the complemented internal control signal 506 (ICS') is driven to or maintained at a high voltage level, and the internal control signal 508 (ICS) is driven to, maintained at, or permitted to drift to a low voltage level. To maintain the complemented internal control signal 506 (ICS') and the internal control signal 508 (ICS) at these voltage levels during a power collapse period 208 (of FIG. 2), the control signal 206 is maintained at a low voltage level during the power collapse event. Example approaches to driving or maintaining the control signal 206 at a low voltage level during a power collapse event are described herein with particular reference to FIGS. 7 and 8.

Hence, with pass gates configured as described herein, a common control signal 206 with the same logical value or voltage level can operate a positive-edge-triggered retention flip-flop 102 to retain slave data 504 in the slave portion 304 (of FIG. 5) and can also operate a negative-edge-triggered retention flip-flop 104 to retain master data 502 in the master portion 306 (of FIG. 6). As indicated above, the second inverter 528 is powered by the collapsible power rail 108. The collapsibility of the second inverter 528 is enabled because the output thereof, which is the internal control signal 508 (ICS), is configured to have a low value during the power collapse period while still contributing to the placement of the transfer pass gate 620 in a closed state and the feedback pass gate 626 in an open state. Thus, the output of the second inverter 528 has a correct value for retaining the master data 502 even if the second inverter 528 undergoes a power collapse.

Figure 7:
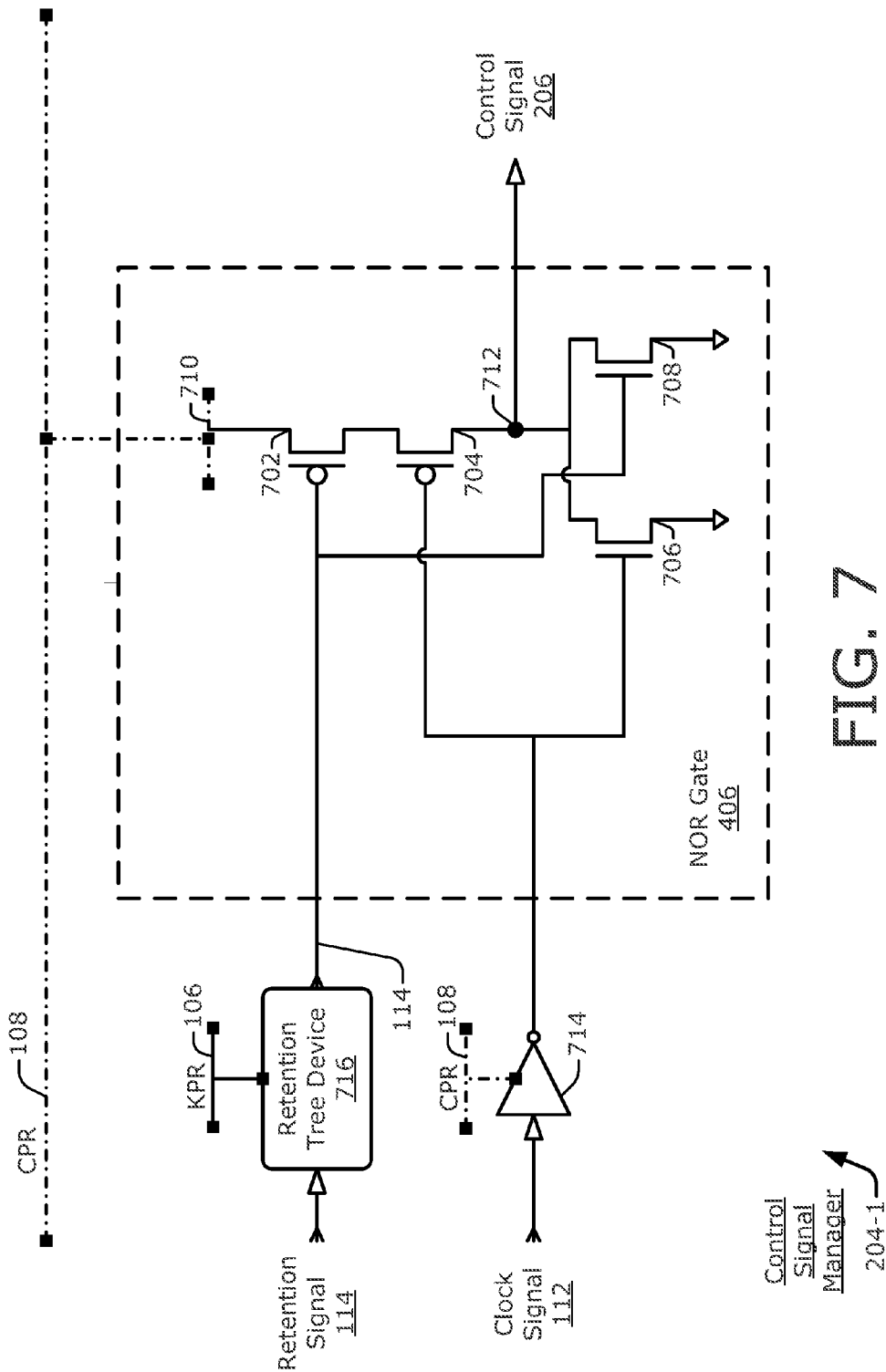
FIG. 7 illustrates an example implementation of a control signal manager.

FIG. 7 illustrates an example implementation 204-1 of the control signal manager 204 of FIGS. 2, 4A, and 4B. The example implementation 204-1 includes three circuit devices: a retention tree device 716, an inverter 714, and a NOR gate 406. The NOR gate 406 includes four devices. More specifically, the illustrated example implementation of the NOR gate 406 includes four transistors: a first p-type metal-oxide-semiconductor transistor 702 (PMOS transistor), a second PMOS transistor 704, a first n-type metal-oxide-semiconductor transistor 706 (NMOS transistor), and a second NMOS transistor 708. The circuit for the NOR gate 406 also includes a power node 710 and an output node 712. FIG. 7 also depicts the collapsible power rail 108 (CPR), the retention signal 114, the clock signal 112, and the control signal 206.

In one or more embodiments, the retention signal 114 is distributed via a retention signal tree that is supported by retention tree devices 716. If the retention signal 114 is active high and is indicated with a high voltage level, the retention signal 114 is distributed by retention tree devices 716 that are powered by the constant power rail 106 (KPR) so that the intended voltage value of the retention signal 114 is maintained during a power collapse event. The clock signal 112 is fed through the inverter 714 to account for the signal inversion caused by the logical NOR operation of the NOR gate 406. In contrast with the retention signal 114, the clock signal 112 ceases to be used during a power collapse event. Consequently, the inverter 714 can be powered by the collapsible power rail 108, as can circuit devices supporting a clock signal tree (not shown).

For the NOR gate 406, the first PMOS transistor 702 and the second PMOS transistor 704 are coupled in series between the power node 710 and the output node 712. The first NMOS transistor 706 and the second NMOS transistor 708 are coupled in parallel between the output node 712 and ground. The power node 710 is coupled to the collapsible power rail 108; hence, the circuit of the NOR gate 406 is powered by the collapsible power rail 108. The clock signal 112, after inversion by the inverter 714, is coupled to the gate inputs of the second PMOS transistor 704 and the first NMOS transistor 706. The retention signal 114 is coupled to the gate inputs of the first PMOS transistor 702 and the second NMOS transistor 708. The NOR gate 406 produces the control signal 206 and provides the control signal 206 at the output node 712.

In an example operation, both the inverted version of the clock signal 112 and the retention signal 114 may be low. If so, these two low values turn on both the first PMOS transistor 702 and the second PMOS transistor 704. These two low values also turn off the first NMOS transistor 706 and the second NMOS transistor 708. In this condition, the output node 712 is driven high to a voltage level that matches that of the collapsible power rail 108. Hence, the control signal 206 is at a high level if both the inverted clock signal 112 and the retention signal 114 are low. On the other hand, either or both of the inverted clock signal 112 and the retention signal 114 may be high. If either or both have high a value, at least one of the first PMOS transistor 702 or the second PMOS transistor 704 is turned off, and at least one of the first NMOS transistor 706 or the second NMOS transistor 708 is turned on. If at least one of the first NMOS transistor 706 or the second NMOS transistor 708 is turned on, the at least one transistor that is turned on pulls the voltage level of the output node 712 down to drive the control signal 206 to a low level.

Consequently, if the retention signal 114 is asserted or active at a high voltage level, the control signal 206 is clamped low. The clamped, low-valued control signal 206 is routed to each of multiple retention flip-flops, such as a positive-edge-triggered retention flip-flop 102 and a negative-edge-triggered retention flip-flop 104, via the input of the first inverter 518 of FIGS. 5 and 6, respectively. Because the retention signal 114 is distributed using the retention tree device 716 that is powered by the constant power rail 106, the retention signal 114 can remain at a high level even if the collapsible power rail 108 is collapsed. The high voltage level of the retention signal 114 is coupled to the gate of the first PMOS transistor 702 to turn it off and is coupled to the gate of the second NMOS transistor 708 to turn it on. With the second NMOS transistor 708 turned on, the output node 712 is brought down to the ground voltage level, which causes the control signal 206 to be at a low level. The low level of the control signal 206 places the transfer, diamond-shaped pass gates 404 of FIGS. 4A-6 in a correct state to isolate the slave data 504 of the slave portion 304 of the positive-edge-triggered retention flip-flop 102 (of FIGS. 4A, 4B, and 5) and to isolate the master data 502 of the master portion 306 of the negative-edge-triggered retention flip-flop 104 (of FIGS. 4A, 4B, and 6) from upstream circuit devices that are collapsing. Moreover, because the control signal 206 performs this isolation functionality at a low voltage level, the NOR gate 406 may be powered by the collapsible power rail 108 because the output node 712 drifts to a low level if the power is collapsed.

Figure 8:
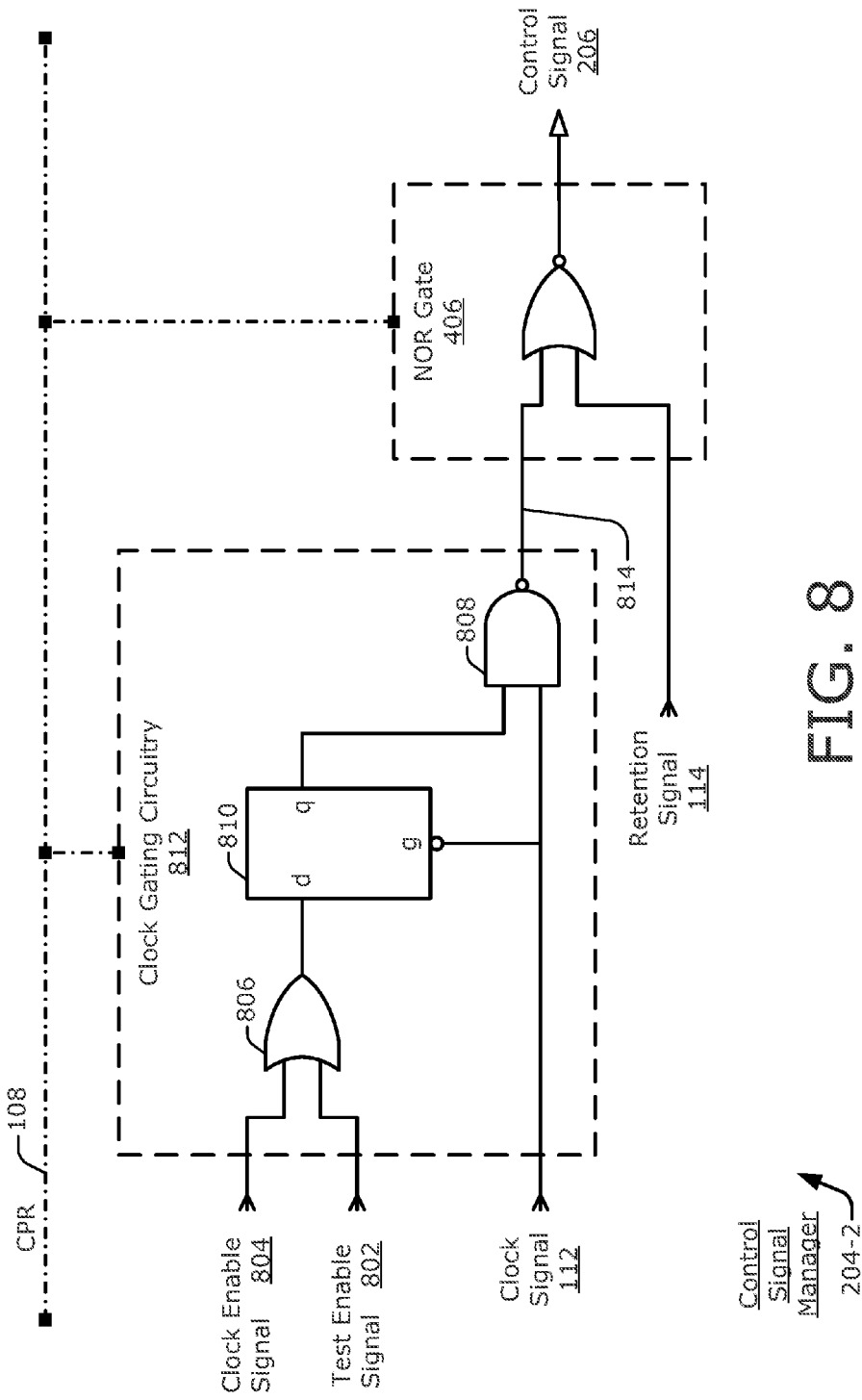
FIG. 8 illustrates another example implementation of a control signal manager.

FIG. 8 illustrates an example implementation 204-2 of the control signal manager 204 of FIGS. 2, 4A, and 4B. The example implementation 204-2 includes clock gating circuitry 812 in conjunction with the NOR gate 406. FIG. 8 also depicts the collapsible power rail 108, a clock enable signal 804, a test enable signal 802, the clock signal 112, the retention signal 114, and the control signal 206. Although no retention tree device 716 is depicted in FIG. 8, the retention signal 114 can be distributed across an integrated circuit using retention tree devices 716, as shown in FIG. 7. Because the clock gating circuitry 812 inverts the clock signal 112, the inverter 714 at the input to the NOR gate 406 in FIG. 7 is omitted. As illustrated, the clock gating circuitry 812 includes an OR gate 806, a dq flip-flop 810, and a NAND gate 808.

In one or more embodiments, the collapsible power rail 108 is coupled to and powers the clock gating circuitry 812 and the NOR gate 406. The clock enable signal 804 is coupled to an upper input of the OR gate 806, and the test enable signal 802 is coupled to a lower input of the OR gate 806. An output of the OR gate 806 is coupled to the "d" input of the dq flip-flop 810. The "q" output of the dq flip-flop 810 is coupled to an upper input of the NAND gate 808. The clock signal 112 is coupled to a lower input of the NAND gate 808. The clock signal 112 is also coupled to an inverting input "g" of the dq flip-flop 810 to advance data through the dq flip-flop 810. The output of the NAND gate 808 produces a gated clock signal 814. A version of the clock signal 112 that is provided to the NOR gate 406 is the gated clock signal 814. More specifically, the gated clock signal 814 is coupled to an upper input of the NOR gate 406. The retention signal 114 is coupled to a lower input of the NOR gate 406. A signal provided at an output of the NOR gate 406 is the control signal 206. The NOR gate 406 may be implemented using multiple transistors, such as with the implementation of FIG. 7 as described above.

In an example operation, starting with the clock gating circuitry 812, the "d" input of the dq flip-flop 810 is at a high level if either or both of the clock enable signal 804 or the test enable signal 802 is at a high level due to the logical inclusive OR operation of the OR gate 806. Hence, the "d" input of the dq flip-flop 810 is at a high level unless the clock enable signal 804 is at a low level (e.g., because the clock gating circuitry 812 is currently tasked with gating the clock) and the test enable signal 802 is also at a low level (e.g., because testing is not occurring). If the "d" input of the dq flip-flop 810 is high, then the "q" output is also high. This high value of the "q" output of the dq flip-flop 810 is fed to the upper input of the NAND gate 808. Due to this high value at the upper input of the NAND gate 808 and the logical NAND operation thereof, the gated clock signal 814 forms an inverted version of the clock signal 112. The gated clock signal 814 is provided to the upper input of the NOR gate 406 and is inverted again due to the logical NOR operation thereof as long as the retention signal 114 is inactive and has a low voltage level. If the gated clock signal 814 were not routed through the NOR gate 406 and were instead being routed to circuitry that is being clocked, the NAND gate 808 can be replaced by an AND gate.

Continuing with the example operation, the gated clock signal 814 is coupled to the upper input of the NOR gate 406, with the gated clock signal 814 forming an inverted version of the clock signal 112 if the clock is not currently being gated by the clock gating circuitry 812. If the retention signal 114 is not active, the retention signal 114 is at a low voltage level. So for a regular operational mode, the NOR gate 406 outputs an inverted version of the gated clock signal 814, which is the original clock signal 112, as the control signal 206. In this regular operational mode, pulses and corresponding values of the control signal 206 therefore track pulses and corresponding values of the clock signal 112.

In a retention operational mode, on the other hand, the retention signal 114 is active and is driven to a high level at the lower input of the NOR gate 406. The retention signal 114 can remain at a high level during a power collapse event because the retention signal 114 is distributed over a retention signal tree of an integrated circuit chip using one or more retention tree devices 716 that are powered by the constant power rail 106, as is shown in FIG. 7. Due to the high value at the lower input of the NOR gate 406 and the logical NOR operation thereof, the control signal 206 that is output from the NOR gate 406 is low-valued regardless of the value of the gated clock signal 814 at the upper input of the NOR gate 406. This low level for the control signal 206 is routed to each of multiple retention flip-flops, such as a positive-edge-triggered retention flip-flop 102 and a nega- tive-edge-triggered retention flip-flop 104, via the input of the first inverter 518 of FIGS. 5 and 6, respectively.

Figure 9:
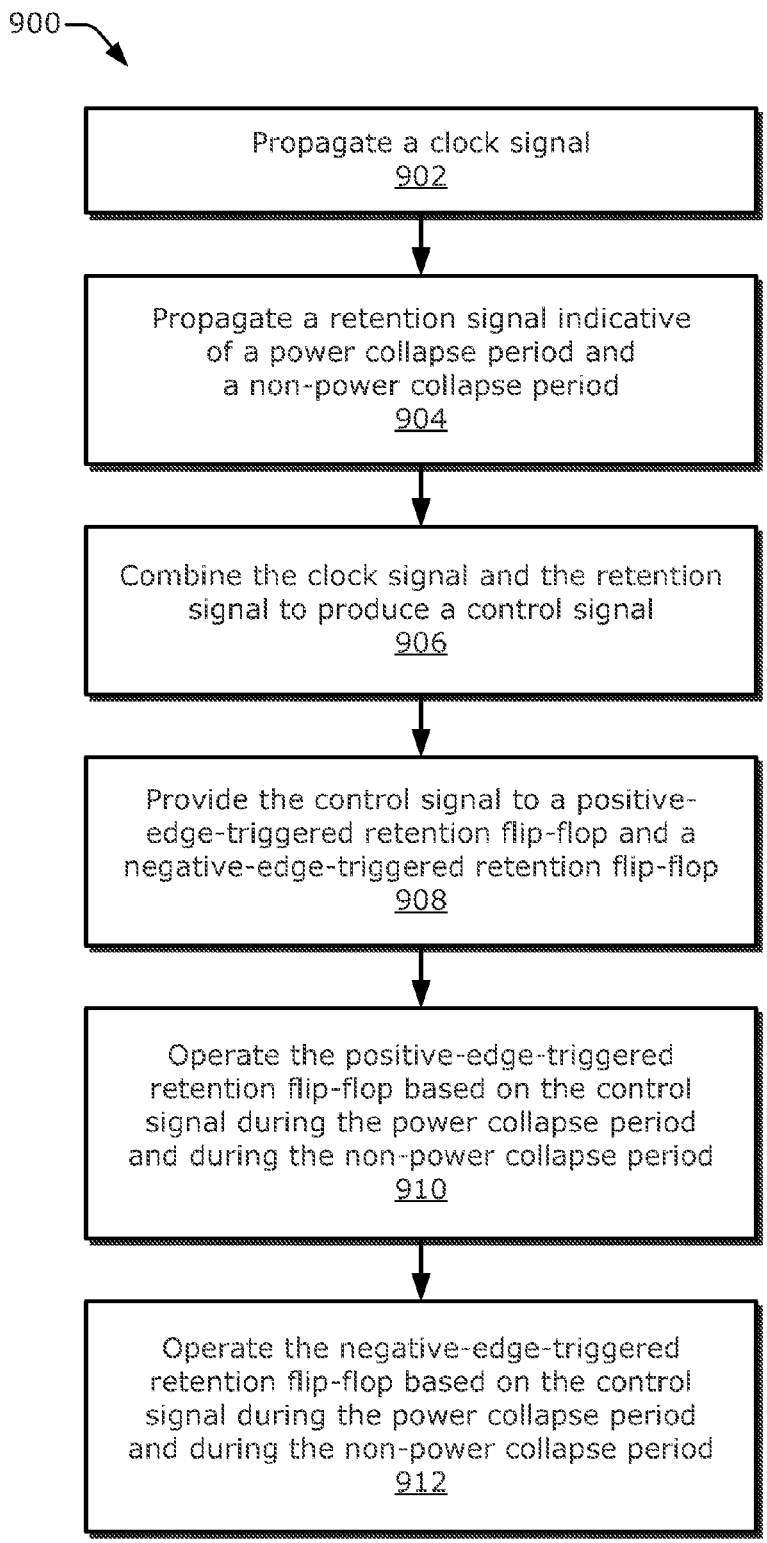
FIG. 9 is a flow diagram illustrating an example process for a unified control scheme for integrated circuit scenarios including both positive-edge-triggered retention flip-flops and negative-edge-triggered retention flip-flops.

FIG. 9 is a flow diagram illustrating an example process 900 for a unified control scheme for integrated circuit scenarios including both positive-edge-triggered retention flip-flops 102 and negative-edge-triggered retention flip-flops 104 in accordance with FIG. 3A or 4A. The process 900 is described in the form of a set of blocks 902-912 that specify operations that may be performed. However, operations are not necessarily limited to the order shown in FIG. 9 or described herein, for the operations may be implemented in alternative orders or in fully or partially overlapping manners. Operations represented by the illustrated blocks of the process 900 may be performed by an integrated circuit, such as an integrated circuit 1010 of FIG. 10, which is described below.

At block 902, a clock signal is propagated. For example, an integrated circuit 1010 can propagate a clock signal 112 to different circuit devices or groups of circuit devices via a clock signal tree. The clock signal provides multiple pulses over time, with each pulse including a rising edge and a falling edge, at least during a regular operational mode to control synchronous circuit devices.

At block 904, a retention signal indicative of a power collapse period and a non-power collapse period is propagated. For example, the integrated circuit 1010 can propagate via a retention signal tree a retention signal 114, which is indicative of a power collapse period 208 and a non-power collapse period 210, to different circuit devices or groups of circuit devices that experience power collapse events. The retention signal 114 may be distributed using retention tree devices 716 that are coupled to a constant power rail 106. If the retention signal 114 is active or asserted, the targeted blocks of the integrated circuit 1010 are to transition from the regular operational mode to a retention operational mode.

At block 906, the clock signal and the retention signal are combined to produce a control signal. For example, a control signal manager 204 can combine the clock signal 112 and the retention signal 114 to produce a control signal 206. To do so, the control signal manager 204 can apply one or more logical operations to the values of the clock signal 112 and the retention signal 114. During the regular operational mode, the control signal 206 may function as the clock signal 112 responsive to an inactive or de-asserted retention signal 114. During the retention operational mode, on the other hand, the control signal manager 204 may clamp the control signal 206 to a constant value for the power collapse period 208 responsive to an active or asserted retention signal 114.

At block 908, the control signal is provided to a positive-edge-triggered retention flip-flop and a negative-edge-triggered retention flip-flop. For example, the control signal manager 204 can provide the control signal 206 to a positive-edge-triggered retention flip-flop 102 and a negative-edge-triggered retention flip-flop 104. With a unified and combined control signal 206, the control signal manager 204 may route one common control signal to multiple different types of retention flip-flops along a single signal path.

At block 910, the positive-edge-triggered retention flip-flop is operated based on the control signal during the power collapse period and during the non-power collapse period. For example, circuitry of the integrated circuit 1010 can operate the positive-edge-triggered retention flip-flop 102 based on the control signal 206 during the power collapse period 208 and during the non-power collapse period 210. Pass gates of the positive-edge-triggered retention flip-flop 102 may be configured by the control signal 206 to enable correct signal propagation or voltage retention during both the power collapse period 208 and the non-power collapse period 210, including isolating the live slave portion 304 during the power collapse period 208.

At block 912, the negative-edge-triggered retention flip-flop is operated based on the control signal during the power collapse period and during the non-power collapse period. For example, the circuitry of the integrated circuit 1010 can operate the negative-edge-triggered retention flip-flop 104 based on the control signal 206 during the power collapse period 208 and during the non-power collapse period 210. Pass gates of the negative-edge-triggered retention flip-flop 104 may be configured by the control signal 206 to enable correct signal propagation or voltage retention during both the power collapse period 208 and the non-power collapse period 210, including isolating the live master portion 306 during the power collapse period 208.

Figure 10:
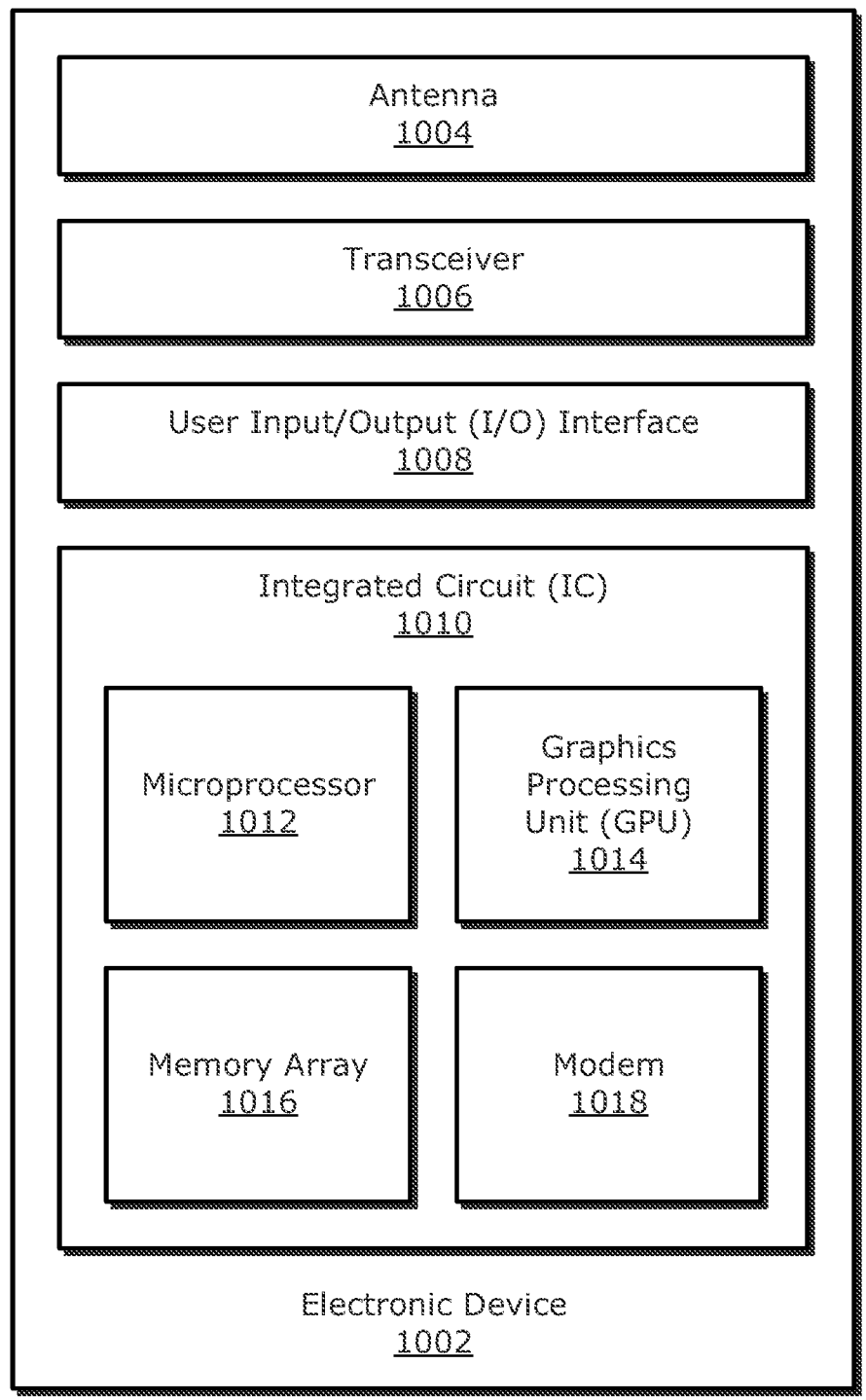
FIG. 10 depicts an example electronic device that includes an integrated circuit having multiple blocks or cores.

FIG. 10 depicts an example electronic device 1002 that includes an integrated circuit (IC) 1010 having multiple blocks or cores. As shown, the electronic device 1002 includes an antenna 1004, a transceiver 1006, and a user input/output (I/O) interface 1008 in addition to the integrated circuit 1010. Illustrated examples of an integrated circuit 1010, or cores thereof, include a microprocessor 1012, a graphics processing unit (GPU) 1014, a memory array 1016, and a modem 1018.

The electronic device 1002 may be a mobile or battery-powered device or a fixed device that is designed to be powered by an electrical grid. Examples of an electronic device 1002 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1002 may also be a device, or a portion thereof, having embedded electronics. Examples of an electronic device 1002 with embedded electronics include a passenger vehicle, industrial equipment, a refrigerator or other home appliance, a drone or other unmanned aerial vehicle (UAV), or a power tool.

For a device with a wireless capability, the electronic device 1002 includes an antenna 1004 that is coupled to a transceiver 1006 to enable reception or transmission of one or more wireless signals. The integrated circuit 1010 may be coupled to the transceiver 1006 to enable the integrated circuit 1010 to have access to received wireless signals or to provide wireless signals for transmission via the antenna 1004. The electronic device 1002 as shown also includes at least one user I/O interface 1008. Examples of an I/O interface 1008 include a keyboard, a mouse, a microphone, a touch-sensitive screen, a camera, an accelerometer, a haptic mechanism, a speaker, a display screen, or a projector.

The integrated circuit 1010 may comprise, for example, one or more instances of a microprocessor 1012, a GPU 1014, a memory array 1016, a modem 1018, and so forth. The microprocessor 1012 may function as a central processing unit (CPU) or other general-purpose processor. Some microprocessors include different parts, such as multiple processing cores, that may be individually powered on or off. The GPU 1014 may be especially adapted to process visual-related data for display. If visual-related data is not being rendered or otherwise processed, the GPU 1014 may be fully or partially powered down. The memory array 1016 stores data for the microprocessor 1012 or the GPU 1014. Example types of memory for the memory array 1016 include random access memory (RAM), such as dynamic RAM (DRAM) or static RAM (SRAM); flash memory; and so forth. If programs are not accessing data stored in memory, the memory array 1016 may be powered down overall or block-by-block. The modem 1018 demodulates a signal to extract encoded information or modulates a signal to encode information into the signal. If there is no information to decode from inbound communications or encode for outbound communications, the modem 1018 may be idled to reduce power consumption. The integrated circuit 1010 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1010 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, or an integrated circuit 1010 generally, may be termed blocks or cores. A core or circuit block of an SOC may be powered down if not in use according to the techniques described in this document. Examples of cores or circuit blocks, in addition to those that are illustrated in FIG. 10, include a voltage regulator, a core memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a processing or GPU circuit block, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
a constant power rail configured to provide power during a power collapse period;
a collapsible power rail configured to cease providing power during the power collapse period;
a positive-edge-triggered retention flip-flop including a master portion and a slave portion, the slave portion coupled to the constant power rail and the master portion coupled to the collapsible power rail; and
a negative-edge-triggered retention flip-flop including a master portion and a slave portion, the master portion coupled to the constant power rail and the slave portion coupled to the collapsible power rail.

2. The integrated circuit of claim 1, wherein:
the positive-edge-triggered retention flip-flop comprises a live slave retention flip-flop configured to transfer data from the master portion to the slave portion responsive to a rising edge of a control signal; and
the negative-edge-triggered retention flip-flop comprises a live master retention flip-flop configured to transfer data from the master portion to the slave portion responsive to a falling edge of the control signal.

3. The integrated circuit of claim 1, wherein:
the positive-edge-triggered retention flip-flop is configured to operate responsive to a control signal; and
the positive-edge-triggered retention flip-flop includes:
a master transfer pass gate configured to be in an open state responsive to a low value of the control signal; and
a slave transfer pass gate configured to be in a closed state responsive to the low value of the control signal.

4. The integrated circuit of claim 1, wherein:
the negative-edge-triggered retention flip-flop is configured to operate responsive to a control signal; and
the negative-edge-triggered retention flip-flop includes:
a master transfer pass gate configured to be in a closed state responsive to a low value of the control signal; and
a slave transfer pass gate configured to be in an open state responsive to the low value of the control signal.

5. The integrated circuit of claim 1, wherein:
the positive-edge-triggered retention flip-flop includes a slave transfer pass gate configured to be in a closed state responsive to a constant value of a control signal such that data is retained in the slave portion of the positive-edge-triggered retention flip-flop during the power collapse period; and
the negative-edge-triggered retention flip-flop includes a master transfer pass gate configured to be in a closed state responsive to the constant value of the control signal such that data is retained in the master portion of the negative-edge-triggered retention flip-flop during the power collapse period.

6. The integrated circuit of claim 1, further comprising:
power management circuitry configured to separately provide a clock signal and a retention signal to the positive-edge-triggered retention flip-flop and the negative-edge-triggered retention flip-flop.

7. The integrated circuit of claim 1, wherein the positive-edge-triggered retention flip-flop and the negative-edge-triggered retention flip-flop are configured to be controlled in accordance with the power collapse period based on whether a retention signal is active, the integrated circuit further comprising:
power management circuitry configured to turn off power to the collapsible power rail for the power collapse period, the power management circuitry including:
a control signal manager configured to provide a clamped signal to the positive-edge-triggered retention flip-flop and the negative-edge-triggered retention flip-flop if the retention signal is active.

8. The integrated circuit of claim 1, further comprising:
a control signal manager configured to:
produce a control signal based on a clock signal and a retention signal; and
provide the control signal to the positive-edge-triggered retention flip-flop and the negative-edge-triggered retention flip-flop.

9. The integrated circuit of claim 8, wherein the control signal manager is further configured to:
forward the clock signal as the control signal if the retention signal is inactive; and
clamp the control signal if the retention signal is active.

10. The integrated circuit of claim 9, wherein:
the control signal is coupled to a slave transfer pass gate of the positive-edge-triggered retention flip-flop and a master transfer pass gate of the negative-edge-triggered retention flip-flop;
the slave transfer pass gate is configured to be in a closed state to prevent data transfer into the slave portion of the positive-edge-triggered retention flip-flop if the control signal is clamped low; and
the master transfer pass gate is configured to be in a closed state to prevent data transfer into the master portion of the negative-edge-triggered retention flip-flop if the control signal is clamped low.

11. An integrated circuit comprising:
a constant power rail;
a collapsible power rail;
first means for storing data responsive to a positive edge of a clock signal, the first means including a slave portion coupled to the constant power rail and configured to retain data during a power collapse period and a master portion coupled to the collapsible power rail; and
second means for storing data responsive to a negative edge of a clock signal, the second means including a master portion coupled to the constant power rail and configured to retain data during the power collapse period and a slave portion coupled to the collapsible power rail.

12. The integrated circuit of claim 11, wherein:
the slave portion of the first means for storing data responsive to the positive edge of the clock signal includes:
a slave transfer pass gate configured to be in a closed state during the power collapse period; and
a slave feedback pass gate configured to be in an open state during the power collapse period; and
the master portion of the first means for storing data responsive to the positive edge of the clock signal includes:
a master transfer pass gate configured to be in an open state during the power collapse period; and
a master feedback pass gate configured to be in a closed state during the power collapse period.

13. The integrated circuit of claim 11, wherein:
the master portion of the second means for storing data responsive to the negative edge of the clock signal includes:
a master transfer pass gate configured to be in a closed state during the power collapse period; and
a master feedback pass gate configured to be in an open state during the power collapse period; and
the slave portion of the second means for storing data responsive to the negative edge of the clock signal includes:
a slave transfer pass gate configured to be in an open state during the power collapse period; and
a slave feedback pass gate configured to be in a closed state during the power collapse period.

14. The integrated circuit of claim 11, further comprising:

power management means for implementing the power collapse period by disconnecting the collapsible power rail from power, the power management means including:
- control management means for producing a control signal based on a clock signal and a retention signal indicative of the power collapse period,
- wherein the power management means is configured to provide the control signal to multiple pass gates of the first means for storing data responsive to the positive edge of the clock signal and the second means for storing data responsive to the negative edge of the clock signal.

15. The integrated circuit of claim 14, wherein:
- the first means for storing data responsive to the positive edge of the clock signal is configured to transfer data from the master portion to the slave portion and to retain data in the slave portion based on values of the control signal; and
- the second means for storing data responsive to the negative edge of the clock signal is configured to transfer data from the master portion to the slave portion and to retain data in the master portion based on the values of the control signal.

16. The integrated circuit of claim 14, wherein the control management means for producing the control signal is configured to:
- forward the clock signal as the control signal if the retention signal is inactive to enable data migration during a non-power collapse period in accordance with pulses of the clock signal; and
- clamp the control signal if the retention signal is active to enable data retention during the power collapse period.

17. An integrated circuit comprising:
- a first retention flip-flop configured to transfer data from a master portion to a slave portion responsive to a rising edge of a control signal, the slave portion configured to retain data during power collapse periods;
- a second retention flip-flop configured to transfer data from a master portion to a slave portion responsive to a falling edge of the control signal, the master portion configured to retain data during the power collapse periods; and
- power management circuitry configured to produce the control signal based on a clock signal and a retention signal, and to route the control signal to the first retention flip-flop and the second retention flip-flop.

18. The integrated circuit of claim 17, wherein the power management circuitry comprises a single metallic path to route the control signal to each of the first retention flip-flop and the second retention flip-flop.

19. The integrated circuit of claim 17, wherein the power management circuitry comprises a control signal manager that is configured to:
- forward pulses of the clock signal as the control signal if the retention signal is inactive; and
- clamp the control signal at a constant value if the retention signal is active.

20. The integrated circuit of claim 19, wherein:
- the constant value comprises a low logical value;
- the slave portion of the first retention flip-flop includes a slave transfer pass gate that is configured to isolate the slave portion from a voltage level of the master portion of the first retention flip-flop responsive to the low logical value; and
- the master portion of the second retention flip-flop includes a master transfer pass gate that is configured to isolate the master portion from a voltage level that is external to the second retention flip-flop responsive to the low logical value.

21. The integrated circuit of claim 19, further comprising:
- a constant power rail, coupled to the slave portion of the first retention flip-flop and the master portion of the second retention flip-flop, configured to continue providing power during the power collapse periods; and
- a collapsible power rail, coupled to the master portion of the first retention flip-flop and the slave portion of the second retention flip-flop, configured to cease providing power during the power collapse periods.

22. The integrated circuit of claim 21, wherein the control signal manager is coupled to the collapsible power rail.

\* \* \* \* \*